(12) United States Patent
Morris

(10) Patent No.: US 7,629,654 B2
(45) Date of Patent: Dec. 8, 2009

(54) BURIED GUARD RING STRUCTURES AND FABRICATION METHODS

(75) Inventor: Wesley H. Morris, Austin, TX (US)

(73) Assignee: Silicon Space Technology Corp., Austin, TX (US)

(*) Notice: Subject to any disclaimer, the term of this patent is extended or adjusted under 35 U.S.C. 154(b) by 142 days.

(21) Appl. No.: 11/949,654

(22) Filed: Dec. 3, 2007

(65) Prior Publication Data

US 2008/0073725 A1 Mar. 27, 2008

Related U.S. Application Data

(63) Continuation of application No. 10/951,283, filed on Sep. 27, 2004, now Pat. No. 7,304,354.

(60) Provisional application No. 60/545,271, filed on Feb. 17, 2004.

(51) Int. Cl.
 H01L 29/76 (2006.01)
 H01L 29/94 (2006.01)
 H01L 31/00 (2006.01)

(52) U.S. Cl. .................. 257/372; 257/373; 257/375; 257/376; 257/409

(58) Field of Classification Search ................ 257/372, 257/659, 409, 376, 375, 373; 438/527
See application file for complete search history.

(56) References Cited

U.S. PATENT DOCUMENTS

| | | | |
|---|---|---|---|
| 4,161,417 A | 7/1979 | Yim et al. | |
| 4,639,761 A | 1/1987 | Singer et al. | |
| 4,980,747 A | 12/1990 | Hutter et al. | |
| 5,138,420 A | 8/1992 | Komori et al. | |
| 5,220,192 A | 6/1993 | Owens et al. | |
| 5,304,833 A | 4/1994 | Shigeki et al. | |
| 5,376,816 A | 12/1994 | Nishigori et al. | |
| 5,386,136 A | 1/1995 | Williams et al. | |
| H1435 H | 5/1995 | Cherne et al. | |
| 5,446,305 A | 8/1995 | Komori et al. | |
| 5,501,993 A | 3/1996 | Borland | |
| 5,641,982 A | 6/1997 | Takahashi | |
| 5,719,733 A | 2/1998 | Wei et al. | |
| 5,728,612 A | 3/1998 | Wei et al. | |
| 5,821,572 A | 10/1998 | Walker et al. | |

(Continued)

OTHER PUBLICATIONS

Bashir, Rashid et al., "A Complementary Bipolar Technology Family With A Vertically Integrated PNP for High-Frequency Analog Application," IEEE Transactions of Electron Devices, vol. 48, No. 11, Nov. 2001, © 2001 by IEEE, pp. 2525-2534.

(Continued)

*Primary Examiner*—Matthew Smith
*Assistant Examiner*—John M Parker
(74) *Attorney, Agent, or Firm*—Zagorin O'Brien Graham LLP

(57) ABSTRACT

Semiconductor devices can be fabricated using conventional designs and process but including specialized structures to reduce or eliminate detrimental effects caused by various forms of radiation. Such semiconductor devices can include the one or more parasitic isolation devices and/or buried guard ring structures disclosed in the present application. The introduction of design and/or process steps to accommodate these novel structures is compatible with conventional CMOS fabrication processes, and can therefore be accomplished at relatively low cost and with relative simplicity.

31 Claims, 23 Drawing Sheets

U.S. PATENT DOCUMENTS

| | | | |
|---|---|---|---|
| 5,835,986 | A | 11/1998 | Wei et al. |
| 5,843,813 | A | 12/1998 | Wei et al. |
| 5,858,828 | A | 1/1999 | Seliskar et al. |
| 5,880,515 | A | 3/1999 | Bartlett |
| 5,894,153 | A | 4/1999 | Walker et al. |
| 5,904,551 | A | 5/1999 | Aronowitz et al. |
| 5,963,801 | A | 10/1999 | Aronowitz et al. |
| 5,966,599 | A | 10/1999 | Walker et al. |
| 5,985,705 | A | 11/1999 | Seliskar |
| 6,057,588 | A | 5/2000 | Yamazaki |
| 6,063,672 | A | 5/2000 | Miller et al. |
| 6,069,048 | A | 5/2000 | Daniel |
| 6,136,672 | A | 10/2000 | Bourdelle et al. |
| 6,137,142 | A | 10/2000 | Burr |
| 6,144,076 | A | 11/2000 | Puchner et al. |
| 6,165,821 | A | 12/2000 | Boden, Jr. et al. |
| 6,171,967 | B1 | 1/2001 | Jun |
| 6,309,940 | B1 | 10/2001 | Lee |
| 6,316,817 | B1 | 11/2001 | Seliskar et al. |
| 6,319,793 | B1 | 11/2001 | Bartlett et al. |
| 6,333,520 | B1 | 12/2001 | Inoue |
| 6,395,611 | B1 | 5/2002 | Belk et al. |
| 6,462,378 | B1 | 10/2002 | Kim |
| 6,472,715 | B1 | 10/2002 | Liu et al. |
| 6,476,451 | B2 | 11/2002 | Wong |
| 6,492,270 | B1 | 12/2002 | Lou |
| 6,501,155 | B2 | 12/2002 | Okawa |
| 6,514,824 | B1 | 2/2003 | Ranazzo et al. |
| 6,525,377 | B1 | 2/2003 | Seliskar |
| 6,664,608 | B1 | 12/2003 | Burr |
| 6,673,635 | B1 | 1/2004 | Hellig et al. |
| 6,706,583 | B1 | 3/2004 | Comard |
| 6,787,858 | B2 | 9/2004 | Zitouni et al. |
| 6,847,065 | B1 | 1/2005 | Lum |
| 6,864,152 | B1 | 3/2005 | Mirbedini et al. |
| 6,885,078 | B2 | 4/2005 | Bartlett et al. |
| 6,940,170 | B2 | 9/2005 | Parikh |
| 7,304,354 | B2 | 12/2007 | Morris |
| 2001/0048135 | A1 | 12/2001 | Leipold |
| 2002/0182884 | A1 | 12/2002 | Bernkopf et al. |
| 2003/0077875 | A1 | 4/2003 | Mandelman et al. |
| 2004/0075144 | A1 | 4/2004 | Zitouni et al. |
| 2005/0269601 | A1 | 12/2005 | Tsubaki |
| 2006/0249759 | A1 | 11/2006 | Morris |
| 2007/0141794 | A1 | 6/2007 | Morris |
| 2008/0142899 | A1 | 6/2008 | Morris |

OTHER PUBLICATIONS

Benedetto, Joseph M., "Economy-Class Ion-Defying ICs in Orbit," reprinted from IEEE Spectrum, vol. 35, No. 3, Mar. 1998, 6 pages.

Bourdelle et al., "Evaluation of High Dose, High Energy Boron Implantation into Cz Substrates for Epi-Replacement in CMOS Technology," IEEE Transactions on Electron Devices, vol. 48, No. 9, Sep. 2001, © 2001 IEEE pp. 2043-2049.

Bourdelle, et al., "Epi-Replacement in CMOS Technology by High Dose, High Energy Boron Implantation into Cz Substrates,"Conference on Ion Implantation Technology; Alpbach, Austria; Sep. 2000, © 2000 IEEE; pp. 312-315.

Frei, M.R., et al., "Integration of High-Q Inductors in a Latch-Up Resistant CMOS Technology," Proceedings of the International Electron Devices Meeting, Dec. 1999, pp. 757-760.

Harame, D.L., et al., Design Automation Methodology and rf/analog Modeling for rf CMOS and SiGe BiCMOS Technologies, IBM J. Res. & Dev., vol. 47, No. 2/3, Mar./May 2003, © 2003 by IBM, pp. 139-175.

Jordan, Anthony, "Rad Hard, Space Ready, Case Study: Evolution of A Fab-Independent Radiation-Hardened COTS IC Supplier," Reprinted from COTS Journal, Nov. 2001, 5 pages.

Leong, K.C., et al., "Super Latch-up Resistance of High Dose, High Energy Implanted p+ Buried Layers," 1998 International Conference on Ion Implantation Technology Proceedings; vol. 1; Kyoto, Japan; © 1999 IEEE; pp. 99-101.

Morris, et al., "Buried Layer/Connecting Layer High Energy Implantation for Improved CMOS Latch-up," 1996 Proceedings of the 11th International Conference on Ion Implantation Technology; Austin, Texas; © 1997 IEEE; pp. 796-799.

Morris, Wesley, "Latchup in CMOS," IEEE 03CH37400, 41st Annual International Reliability Physics Symposium, Dallas, Texas, 2003, © 2003 by IEEE, pp. 76-84.

Morris. W., et al., "Technical and Economic Considerations for Retrograde Well and Channel Implants," Proceedings of IEEE Conference on Ion Implantation Technology, Sep. 17-22, 2000, pp. 73-76.

Pech et al., "Extended Defects in Silicon by MeV B++ Implantation in Different 8" Cz-Si Wafers," 1998 International Conference on Ion Implantation Technology Proceedings; vol. 2; Kyoto, Japan; © 1999 IEEE; pp. 756-759.

Rubin et al., "Effective Gettering of Oxygen by High Dose, High Energy Boron Buried Layers," 1998 International Conference on Ion Implantation Technology Proceedings; vol. 2; Kyoto, Japan; © 1999 IEEE; pp. 1010-1013.

Rubin et al., "Process Architectures Using MeV Implanted Blanket Buried Layers for Latch-Up Imrovements on Bulk Silicon," 1996 Proceedings of the 11th International Conference on Ion Implantation Technology; Austin, Texas; © 1997 IEEE; pp. 13-16.

Rubin, L.M., et al., "Process Control Issues for Retrograde Well Implants for Narrow n+/p+ Isolation in CMOS," Proceedings of the 14th International Conference on Ion Implantation Technology, Sep. 22-27, 2002, pp. 17-20.

Voldman, S. et al., "The Influence of Heavily Doped Buried Layer Implants on Electrostatic Discharge (ESD), Latchup, and A Silicon Germanium Heterojunction Bipolar Transistor in A BiCMOS SiGe Technology," 42nd Annual Reliability Physics Symposium Proceedings, 2004, Publication Date: Apr. 25-29, 2004, IEEE International, pp. 143-151.

Wolf, S. and Tauber, R.N., "Silicon Processing for the VLSI Era, vol. 1: Process Technology", Published by Lattice Press in 2000, pp. 256-259; 406 and 407.

Ziegler, J.F., et al., "IBM Experiments in Soft Fails in Computer Electronics (1978-1994)," IBM J. Res. Develop., vol. 40, No. 1, Jan. 1996, © 1996 by IBM, pp. 3-18.

U.S. Appl. No. 11/949,708, filed Dec. 3, 2007, naming inventor Wesley H. Morris.

Van Zant, Peter, Microchip Fabrication: A Practical Guide to Semiconductor Processing, McGraw-Hill, 2000, Ch. 3: pp. 62-63; Ch. 13: pp. 396-397, 402-403, and 406-407.

Final Office Action mailed May 29, 2009 for U.S. Appl. No. 11/581,561, 11 pages.

Non-Final Office Action mailed Aug. 27, 2008 for U.S. Appl. No. 11/581,561, 10 pages.

Non-Final Office Action mailed Sep. 22, 2005 for U.S. Appl. No. 10/951,283, 15 pages.

Final Office Action mailed Jun. 9, 2006 for U.S. Appl. No. 10/951,283, 16 pages.

Non-Final Office Action mailed Feb. 7, 2007 for U.S. Appl. No. 10/951,283, 10 pages.

Final Office Action mailed Sep. 20, 2007 for U.S. Appl. No. 10/951,283, 6 pages.

BURIED GUARD RING STRUCTURES AND FABRICATION METHODS

CROSS-REFERENCE TO RELATED APPLICATION(S)

This application is a continuation of application Ser. No. 10/951,283, filed Sep. 27, 2004, entitled "Buried Guard Ring And Radiation Hardened Isolation Structures And Fabrication Methods" and naming Wesley H. Morris as the inventor, which application claims the benefit, under 35 U.S.C. § 119 (e), of U.S. Provisional Application No. 60/545,271, filed Feb. 17, 2004, entitled "Buried Guard Ring And Radiation Hardened Isolation Structures And Fabrication Methods" and naming Wesley H. Morris as the inventor. Each of the above-referenced applications is hereby incorporated by reference herein in its entirety.

BACKGROUND

1. Field of the Invention

The present invention relates to integrated circuits, and particularly to integrated circuits with partial and/or complete immunity to failure modes associated with radiation exposure.

2. Description of the Related Art

The high radiation environments, including the upper atmosphere, near-earth orbit, outer space, and certain terrestrial environments (e.g., proximity to devices producing significant amounts of radiation) provide the most hostile environments for reliable operation of microelectronic solid-state devices. Exposure to radiation causes electrical degradation of both transistors and circuit-isolation elements, which can lead to sporadic device behavior and/or complete destructive failure of integrated circuits (ICs). Because of the complexities of designing and fabricating integrated circuits tolerant of radiation environments, during the 1980s a number of large commercial semiconductor companies began to specialize in the production of radiation-hardened ICs, primarily for military and aerospace systems.

At the same time, the high manufacturing costs of non-radiation-hardened commercial ICs has generally been offset by progress in high volume production, growing from less than $40B to more than $200B in 2004. To remain competitive, commercial IC manufacturers have deployed new state-of-the art silicon IC manufacturing facilities every 3-5 years.

The more limited low-volume demand for radiation-hardened ICs cannot justify the expense of dedicated leading-edge manufacturing facilities, despite the very attractive margins in the military and aerospace electronics market. These financial constraints have severely limited the ability of radiation-hardened IC suppliers to utilize leading-edge IC manufacturing technology. Consequently, the number of companies producing radiation-hardened IC components has been dramatically reduced, and their capabilities have fallen far behind those of the commercial sector.

During the 1990s, the combination of rising costs for new IC manufacturing facilities, military budget reductions, and a dwindling number of suppliers widened the technological disparity between commercial and radiation-hardened microelectronics. Commercial and military satellite manufacturers attempting to bridge this gap were forced to employ a new concept called "COTS" (commercial off-the-shelf) to procure the high-performance ICs required for building their electronic platforms.

The COTS approach uses extensive laboratory testing of commodity (unhardened) commercial ICs to screen and "qualify" them for applications where they are likely to be exposed to damaging radiation. COTS was considered the only practical solution to obtain space-qualified high-performance ICs. Despite greatly diluted radiation standards, qualified product could not reliably be found using COTS. Therefore, those few nominally acceptable ICs typically offered no significant cost savings. Satellites manufactured using COTS ICs have suffered significant reductions in capability and mission lifetime due to destructive radiation exposure. The advancing miniaturization of CMOS technology increases sensitivity to certain forms of radiation, further widening the gap between COTS capabilities and space electronics market requirements. After more than ten years of system failures, the COTS approach has failed to provide a viable solution for the supply of radiation-hardened ICs.

Accordingly, it is desirable to bring high-performance and cost-effective radiation-hardened integrated circuits (RHICs) to military, aerospace, and certain terrestrial electronics markets using the readily accessible leading-edge infrastructure of high-volume commercial microelectronics manufacturers. More specifically, it is further desirable to systematically address at the silicon process level each of the degradation mechanisms caused by radiation and to thereby develop new radiation hardened solutions that can be integrated into commercial microelectronic fabrication processes without impacting significantly the commercial baseline electrical spice parameters. This methodology offers the promise of circuit intellectual property (IP) re-use which would create new and distinct radiation hard circuit products from existing commercial circuit designs while avoiding costly circuit redesigns.

SUMMARY

It has been discovered that semiconductor devices can be fabricated using conventional designs and process but including specialized structures to reduce or eliminate detrimental effects caused by various forms of radiation. Such semiconductor devices can include the one or more parasitic isolation devices and/or buried guard ring structures disclosed in the present application. The introduction of design and/or process steps to accommodate these novel structures is compatible with conventional CMOS fabrication processes, and can therefore be accomplished at relatively low cost and with relative simplicity.

Accordingly, one aspect of the present invention provides a semiconductor device which includes a substrate, a first well and a second well, a buried layer, and a conductive region. The substrate has a region of a first conductivity type and a first substrate impurity concentration. The first well has the first conductivity type, and the first well includes a first well contact region, and also includes a first transistor drain region and source region disposed within the first well. The second well has a second conductivity type opposite the first conductivity type. The buried layer has the first conductivity type and has a buried layer impurity concentration greater than the first substrate impurity concentration. The buried layer is also disposed within the substrate below the first well and extends continuously beneath the drain and source regions of the first transistor. The conductive region is disposed between the buried layer and one of the first well contact region and a substrate surface terminal within the first well. The conductive region has a smaller lateral extent than that of the first well, and provides a higher conductance between the buried layer and said one of the first well contact region and the substrate surface terminal than a conductance otherwise provided by the first well and the substrate region in the absence of said conductive region.

The foregoing is a summary and thus contains, by necessity, simplifications, generalizations and omissions of detail; consequently, those skilled in the art will appreciate that the summary is illustrative only and is not intended to be in any way limiting. As will also be apparent to one skilled in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DESCRIPTION

Figure 1A:
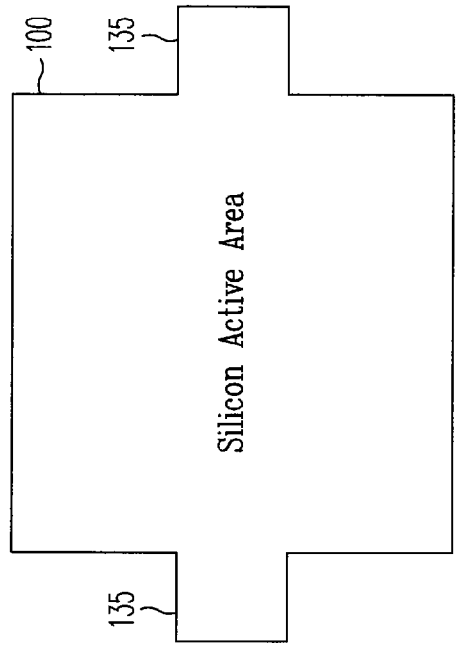
FIGS. 1A-1H illustrate simplified block diagrams of a transistor structure utilizing one of the techniques of the present invention.
Figure 1C:
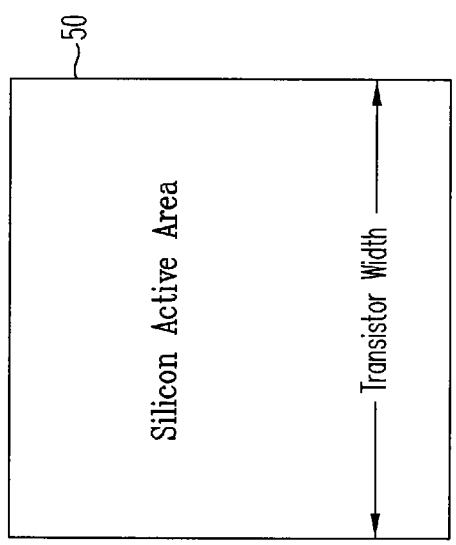
Figure 1B:
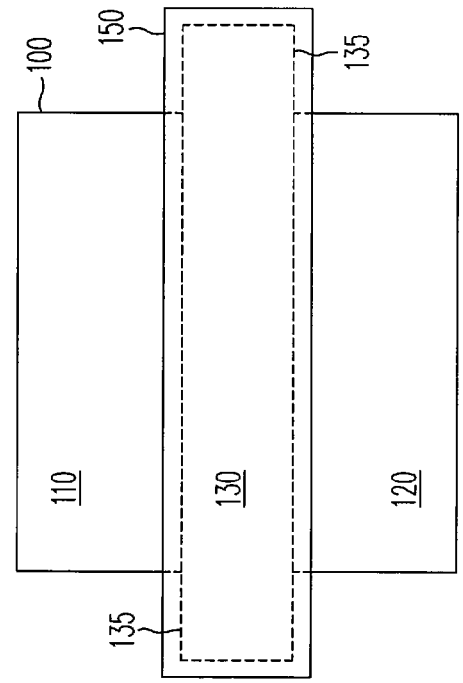
Figure 1D:
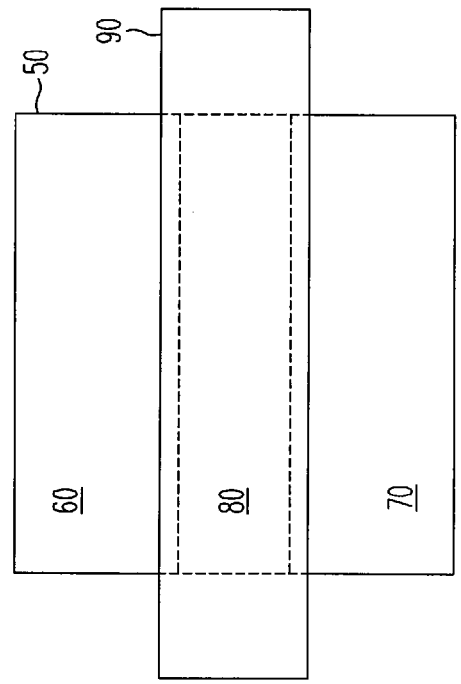

The following sets forth a detailed description of at least the best contemplated mode for carrying out the one or more devices and/or processes described herein. The description is intended to be illustrative and should not be taken to be limiting.

The devices and techniques described in the present application can deliver a complete radiation solution, or in some cases a specialized radiation solution, by directly addressing one or more of the primary degradation radiation effects of ICs: Total Ionizing Dose (TID), Single Event Latch-up (SEL), and Single-Event Upset (SEU). Moreover, the solutions to these degradation mechanisms are accomplished at the silicon process level with modifications to existing foundry baseline process. These unique approaches can be integrated into any CMOS process flow without affecting the performance of the underlying baseline technology. These approaches can further take advantage of a variety of different IC fabrication technologies, such as silicon-on-insulator (SOI) and the like. Additionally, although the examples of the present application will focus on MOS (and particularly CMOS) implementations, it will be understood by those having ordinary skill in the art that the devices and techniques disclosed herein can be extended to other semiconductor architectures such as BiCMOS, etc.

This disclosure describes various structures and techniques that each generally provide some manner of protection from one or more of the degradation effects associated with radiation, and particularly ionizing radiation. When combined, these structures and techniques provide novel radiation hardened process isolation (RHPI) schemes. When integrated into a CMOS process silicon structure, the RHPI structures can significantly reduce the sensitivity of the silicon electrical devices to ionizing radiation, single event latch up, and single event soft error. The RHPI structures can generally be applied to any MOS or BiCMOS silicon process and will directly improve radiation hardening properties of the integrated circuit both during and after exposure to a radiation environment. Moreover, this is accomplished with little or no penalty to circuit size and or electrical performance. As such, the RHIP schemes can be used as an "add on" feature, which can be applied to existing MOS or BiCMOS process technology, improving radiation isolation properties without the need for extensive process or circuit changes. The RHPI structures enable radiation hardening of commercial digital process by leveraging existing solid state processing technology and re-use of leading edge circuit IP for the creation of radiation hardened circuit product.

Ionizing radiation occurs naturally in the form of high-energy photons or charged particles that possess enough energy to break atomic bonds and create electron hole pairs in an absorbing material. These particles can include protons, electrons, atomic ions, and photons with energies greater than a bandgap of the absorbing material. When typical integrated circuits, such as CMOS integrated circuits, are exposed to the charged particles over a period of months or even years, the ionizing radiation can contribute to a total ionizing dose (TID). For example, as an ionizing particle passes through a MOS device, it generates one or more electron-hole pairs which can be trapped in the gate oxides and the field oxides. Electrons in the semiconductor's valence band are raised to the conduction band. A fraction of the electron-hole pairs will undergo initial recombination and cause no damage, but such recombination decreases as the electric field increases, and the electrons and holes that survive it are free to diffuse and drift within the oxide where they will be swept from the insulator, recombine, or be trapped.

Mobile electrons typically move through both gate and field oxides quickly, but the holes have a relatively low effective mobility and are easily trapped in gate oxides and field oxides. Because the trapped holes create a positive oxide charge, the resulting space-charge fields cause negative shifts in the threshold voltages of corresponding transistors. As a threshold voltage shifts negatively, a transistor biased in the off-state lets more and more current pass. If enough holes are trapped, an n-channel transistor will remain fully conducting even with zero applied gate bias, causing, for example, an enhancement-mode device to become a depletion-mode device. In many cases, the edge or field region of the device becomes depletion-mode. Should that happen, leakage currents passing around a device (or from device to device) can cause parameter degradation and, ultimately, device and circuit failure.

Ionizing radiation also boosts the interface trap density in MOS structures. Interface traps are localized electronic states close to the interface between silicon and silicon dioxide and can exchange charge with the silicon conduction and valence bands. They shift threshold voltage and can also degrade mobility by acting as scattering centers. More specifically, the increase in interface states shifts the threshold voltages in the negative direction (more depletion $V_t$) for n-channel devices and in the positive direction (more enhancement $V_t$) for p-channel devices. In addition to the positive oxide shift and the interface states shift described above with respect to n-channel and p-channel devices, threshold voltage shifts caused by ionizing radiation further affect parasitic MOS elements, giving rise, for example, to leakage currents that may cause parametric failure and/or functional failure.

Even more specialized devices can be susceptible to TID. For example, SOI transistors can also be affected by TID through charge buildup in the insulator such as a buried oxide. For partially depleted transistors, charge buildup can invert the back surface causing a source-to-drain (back-channel) leakage current. Moreover, this leakage current is relatively unaffected by gate bias. For fully-depleted transistors, there is significant sensitivity to radiation-induced oxide and interface-trap charge buildup. Positive oxide charge buildup tends to deplete the back-channel interface causing a decrease in the threshold voltage of the front-channel gate oxide and increased back-channel leakage current. Thus, a wide variety of threshold voltage instabilities can result.

Thus, the effects of ionizing radiation lead to the degradation of performance and ultimate failure of the CMOS devices. The additional radiation-induced interface states degrade the circuit performance by reducing the channel mobility, which as a result decreases channel conductance and transistor gain. Over time, the threshold voltages of the n-channel and p-channel devices may shift to such a degree where the n-channel transistors cannot be turned off and the drive capability of the p-channel transistors is not sufficient for the circuit to continue operating at the system clock rate. Such a shift in threshold voltages of either the n-channel or p-channel transistors can cause a circuit to fail.

FIGS. 1A-1H illustrate one approach to addressing the parasitic effects associated with TID in a conventional MOS device. Transistor 100 (shown in FIGS. 1B and 1D-H) differs from conventional MOS devices (shown in FIGS. 1A and 1C) in that channel region 130 of transistor 100 includes two channel region extensions 135. In traditional MOS devices like transistor 50, source (60), drain (70), and channel regions (80) are typically fabricated to have approximately the same width as shown. However, as shown in FIGS. 1B and 1D-H, source region 110 and drain region 120 have approximately the same widths while channel region 130 has a greater width leading to channel region extensions 135 that extend beyond the edges of the source and drain regions, i.e., beyond the channel region's typical interfaces with each of the source and drain regions. Channel region extensions 135 are typically formed by an extension of the silicon active area from which the source, drain, and channel regions are formed, or by formation of mesa regions immediately adjacent to the channel region. Because of their role in reducing the parasitic effects associated with TID, these extended active area structures can be referred to as parasitic isolation devices (PIDs).

Figure 1F:
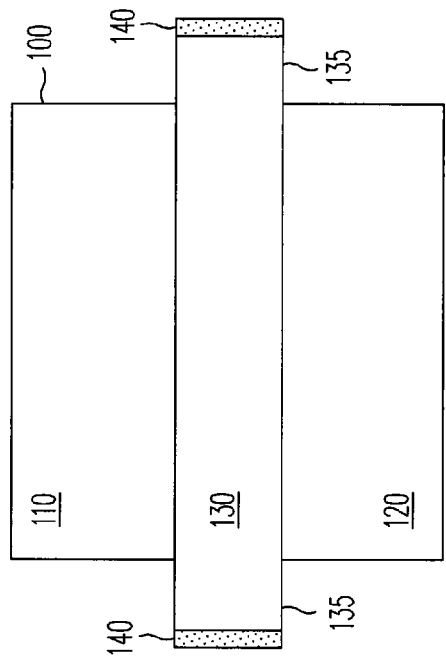
Figure 1H:
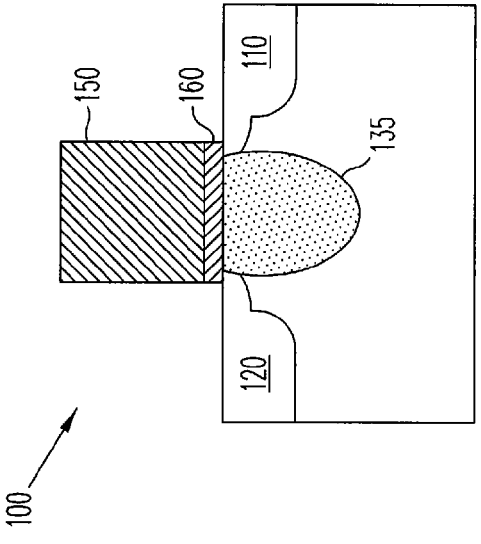
Figure 1E:
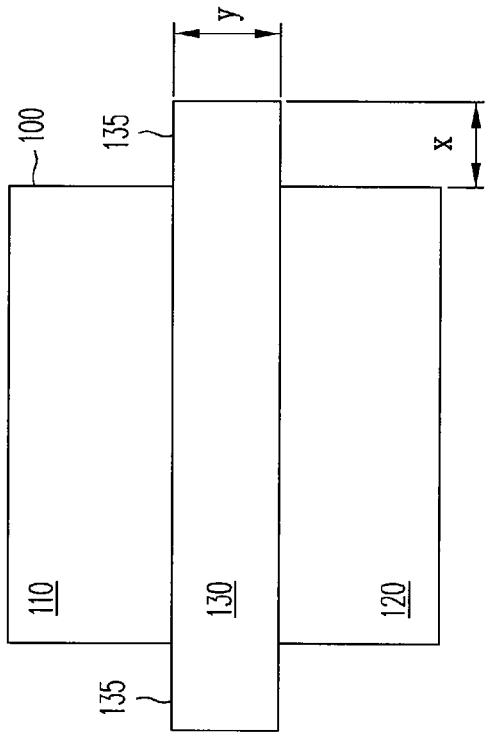

Each of channel region extensions 135 have a width x and a length y (FIG. 1E). Although FIGS. 1B and 1D-H illustrate channel region extensions 135 having approximately the same dimensions as each other, this need not be the case. Channel region extension length y is typically smaller than the length of polysilicon gate 150, while channel region extension width x can be selected to provide the desired device features. The increased length of the channel edge caused by the extensions, i.e., and increase from y to 2x+y, serves to increase the effective channel length of channel region 130 to a value greater than the case where the channel region terminates "flush" with source and drain regions 110 and 120. By increasing the net channel edge length, channel region extensions 135 lead to significantly reduced OFF state leakage due to the attenuation of parasitic transistor short channel effects.

Figure 1G:
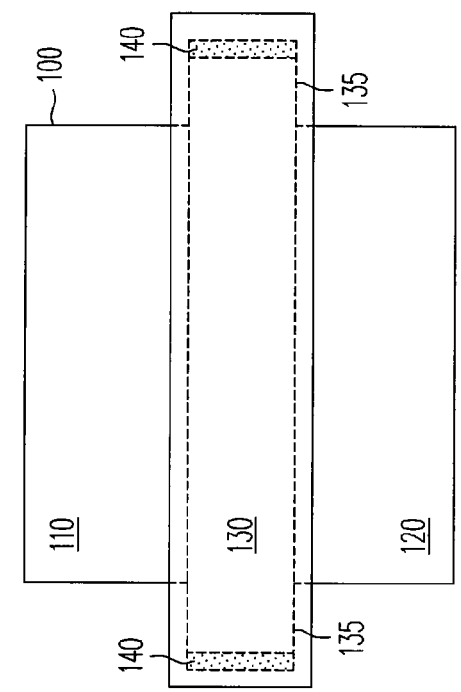

In a typical implementation, the PID structure effectively increases the local channel length by more than a factor of two. The geometry of the PID provides for selective doping within specific regions 140 as shown in FIGS. 1F-1H. FIGS. 1F and 1G show top views of device 100 including channel extension impurity regions 140, typically formed along the length of channel region extensions 135. Channel extension impurity regions 140 are typically formed to have relatively high impurity concentrations, and are introduced to overlap end portions of the channel region extensions so that the impurity concentration of these end portions is increased relative to the impurity concentration of those portions of the channel region 130 located between source region 110 and drain region 120. For example, where the channel region has a p− impurity concentration, channel extension impurity regions 140 form a pair of p+ channel stops. This relatively high impurity concentration of the channel stop insures that the parasitic sidewall threshold is higher than any negative threshold shift which might be induced by ionizing radiation. These more heavily doped extension impurity regions are typically spaced apart from the endwall edges of source and drain regions 110 and 120 by respective portions of the extension regions of the same doping concentration as channel region 130 itself, so that the more heavily doped channel extension impurity regions do not form p+/n+ junctions with the source and drain regions 110 and 120. Such junctions can have very low breakdown voltages, thereby adversely effecting device performance. The extension width x is generally determined by the choice of doping ion and the manufacturing process's thermal diffusion exposure. For example, a boron doped PID structure would typically have a larger extension width x as compared to an Indium doped PID structure. Thus, extension width will typically be driven by concerns about excess back-diffusion and enhanced doping of the transistor active area. In general, either acceptor or donor impurities can be used to form channel extension impurity regions 140. Variation of impurity type, implant energy, and dose will typically provide different types and/or levels of radiation isolation improvement.

As shown in FIG. 1G, channel region extensions 135 are located below (and hidden by) gate electrode 150, which allows self aligned conventional processing to be used subsequent to PID formation. In the case of n-channel devices, the channel region extensions when combined with impurity doping can be used to prevent unwanted electrical inversion (threshold voltage depletion) of the edges (or sides) of the n-channel transistor silicon channel area. This sensitive region generally extends below the gate electrode between source region 110 and drain region 120, as illustrated in FIG. 1H which shows an end view of the device. Thus, in some embodiments, channel extension impurity regions 140 are formed to extend to a depth greater than the depths of the source and drain regions. The PID can likewise be used in p-channel transistors to prevent threshold voltage enhancement (opposite of n-channel) caused by positive charge accumulation along the active area edge of the PMOS transistor active area. Note that because the PID structure can increase the size of the transistors active area, gate capacitance may also increase. This can lead to reduced speed in operation of the transistor. To compensate for this effect, various embodiments can adjust different aspects of the device geometry. For example, in one embodiment the width of the PMOS can be increased to help reduce the gate capacitance.

Thus, the PID structure reduces or eliminates parasitic field transistor inversion which reduces or eliminates a major source of $I_{off}$ leakage caused by charge build up at the silicon/ $SiO_2$ (160) boundary. Moreover, the PID structure doped region provides for local minority carrier lifetime reduction, reduced sensitivity to substrate noise and body voltage effects, and enhances the transistor snap-back voltage. The PID structures described herein can be fabricated in both bulk silicon and silicon films, such as silicon-on-insulator (SOI).

Latch-up generally, and in the case of circuits in radiation environments SEL, is a serious failure mode in CMOS circuits. In the best case, latch-up results in soft failure with a loss of data or logic state. In the worst case, latch-up causes a destructive hard failure with permanent loss of the circuit. Thus, from a circuit reliability perspective, latch-up is to be avoided at all costs. As isolation widths shrink, device structures become even more susceptible to both latch-up failure modes. Prevention of both transient and destructive failures is very important in advanced CMOS IC's since most conventional CMOS technologies have largely converged on the use of p– bulk substrates. As noted above, radiation environments present special problems to CMOS circuits in that high-energy particles deposit significant electrical charge to the bulk substrate. The instantaneous appearance of static charge deposited by a high-energy particle passing through an IC can immediately induce large displacement currents on the picosecond time scale accompanied with rapid potential shifts away from initial logic states. The deposition of energy by the particle typically causes diodes to forward bias, followed by large transient injection currents which reinforce the transient upset and can cause the CMOS circuit to latch-up.

Figure 2:
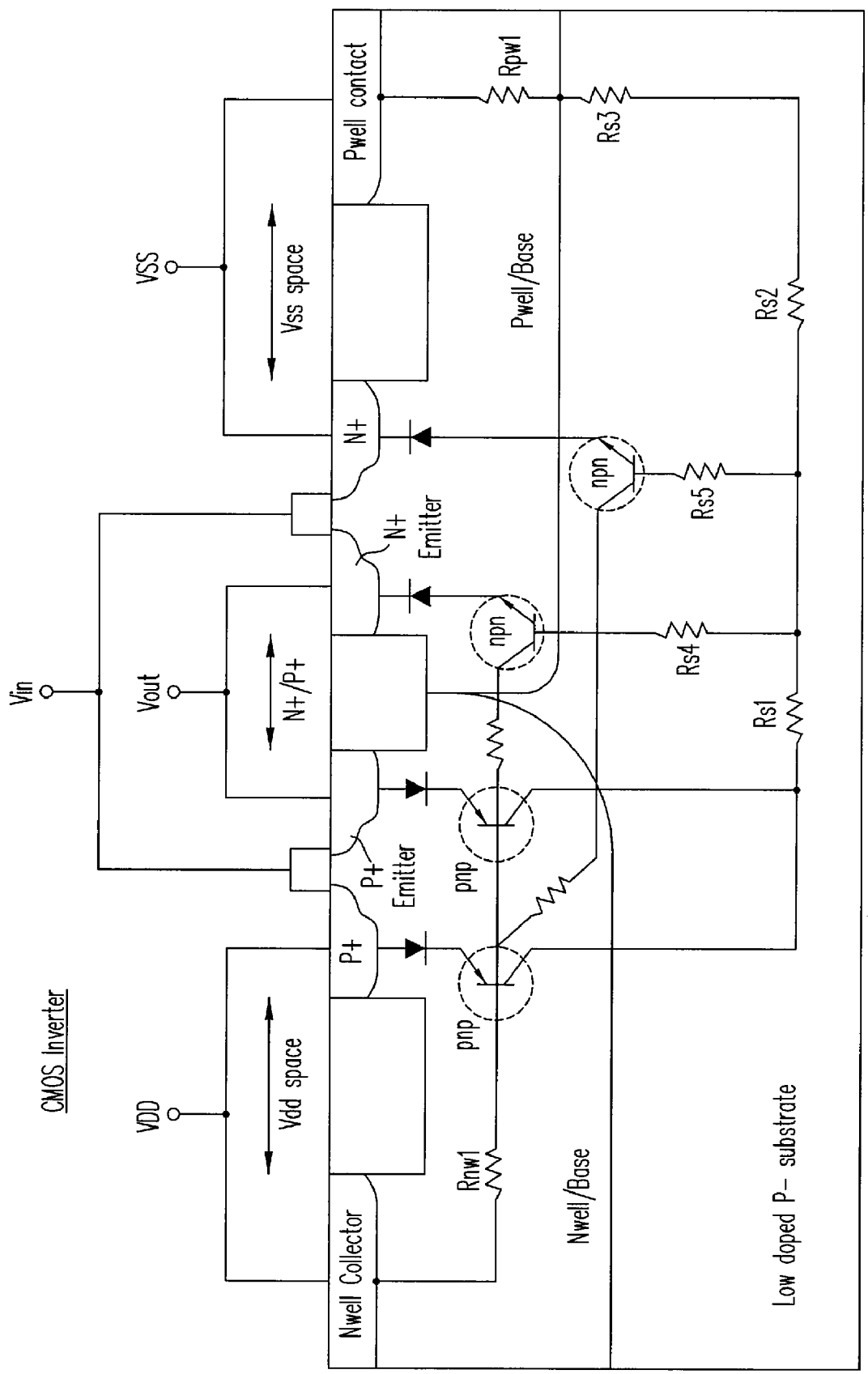
FIG. 2 shows a cross-section diagram of a CMOS inverter formed on a p– substrate.

Latch-up in a conventional CMOS inverter circuit is illustrated in FIG. 2. FIG. 2 shows a cross-section diagram of a CMOS inverter formed on a p-substrate. An equivalent circuit diagram is also shown in FIG. 2 overlaid on the CMOS inverter. In CMOS technology, the basic switching circuit is an inverter formed from a complementary pair of MOS transistors, one NMOS and one PMOS. Electrical isolation is achieved by using both dielectric and pn junction diodes. P-type doped regions (p-wells) isolate NMOS transistors, while n-typed doped regions (n-wells) isolate PMOS transistors. FIG. 2 illustrates the parasitic electrical elements, bipolar transistors, resistors and diodes, that co-exist within the CMOS structure. The source and drain regions of each MOSFET in the inverter form bipolar emitters. In normal operation, the circuit maintains a reverse bias of the diodes formed by the n-well/p-substrate, the p+/n– junction of the PMOS and the n+/p– junction of the NMOS. External factors such as leakage, circuit switching noise, particle upset, and transient overvoltage at the p+ diffusion or undervoltage at the n+ diffusion can trigger one of both of the parasitic bipolar devices into the active state. If either of the emitter or base junctions is forward biased, emitter currents will be sourced to corresponding base/collector regions, immediately shifting the local potential from its initial voltage state.

The network parasitic devices forms a pnpn silicon controlled rectifier (SCR) power device which can be unintentionally biased into a high current, low impedance state, thereby causing latch-up. The circuit elements $R_{S1}$, $R_{S2}$, and $R_{S3}$ are the net effective bulk p– substrate resistors, while $R_{NW1}$ is the n-well series resistance and $R_{PW1}$ is the p-well series resistance. In conventional technology substrate resistors would have resistances on the order of 1 kΩ or greater. In a typical example of CMOS circuit operation, the bulk substrate represents ground potential (0 volts) and is referred to as $V_{SS}$. If current is injected from any source available to the p– substrate, the local potential (within the p– substrate) will increase in magnitude above zero volts as a function of the high value substrate resistance. The n+/p– diffusion diodes located in the p-well, and which were previously undisturbed, would then enter a forward biased conduction as the P– substrate potential increases above approximately 0.3 volts. It is this second contribution by the previously undisturbed n+/p– diffusion diodes which now positively enhances the initial small signal upset event, and can lead to latch-up. Likewise the same event is possible starting with forward biased p+/n– diffusion diodes which are located within the n-well isolation doping region that is caused by either an over voltage of the p+ diffusion or a transient under voltage condition existing within the n-well local potential, which typically equals the circuit supply voltage or terminal voltage ($V_{DD}$, or $V_{CC}$).

Thus, the network of series resistors plays a direct role in the transient bias states of the different impurity doped regions, which then directly influences the bias and conduction state of the diodes. Latch-up can be prevented by keeping the diodes in their reversed bias (off) states. A first step in reducing or preventing latch-up is reducing the effective resistance of p– substrate resistors $R_{S1}$, and $R_{S2}$. The p– substrate resistance can be reduced using a high-dose buried layer (HDBL) 300 as illustrated in FIG. 3.

Figure 3:
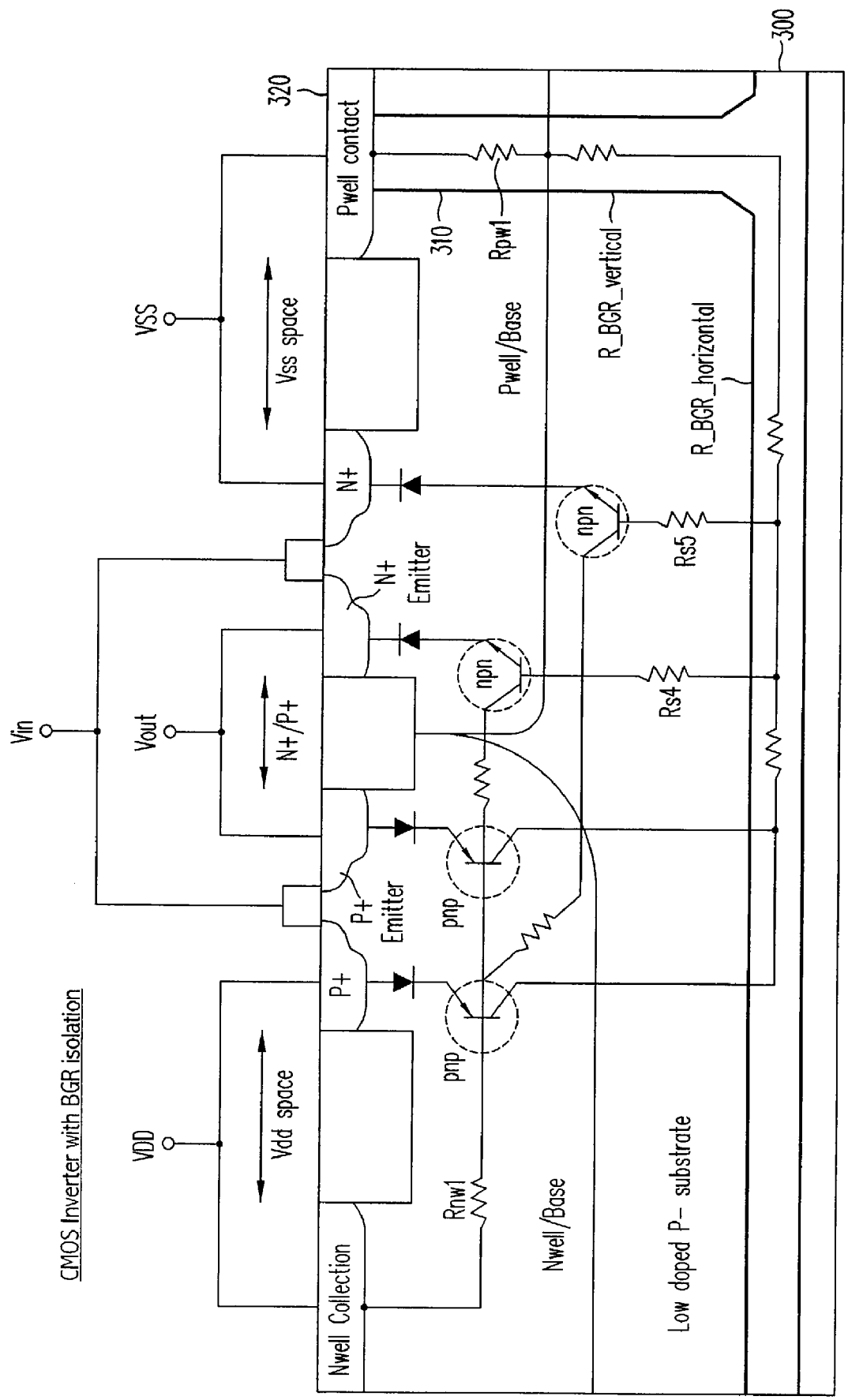
FIG. 3 illustrates a simplified block diagram of an inverter structure utilizing several of the techniques and devices of the present invention.
Figure 12:
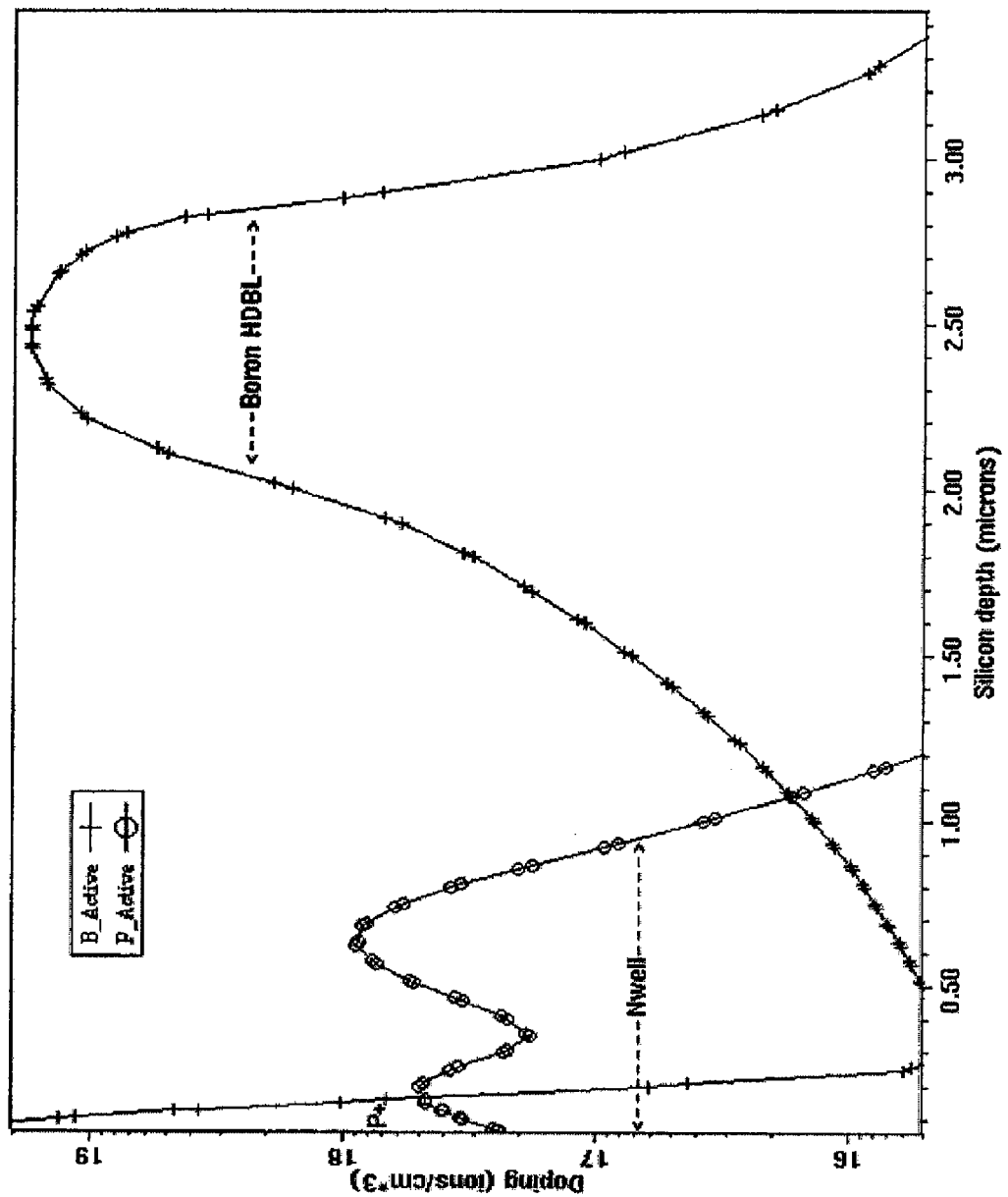
FIGS. 12-13 illustrate 1D simulations of doping profiles showing respectively an exemplary HDBL below a p+ diffusion in an n-well, and below a p+ diffusion in a p-well, for an exemplary process.
Figure 13:
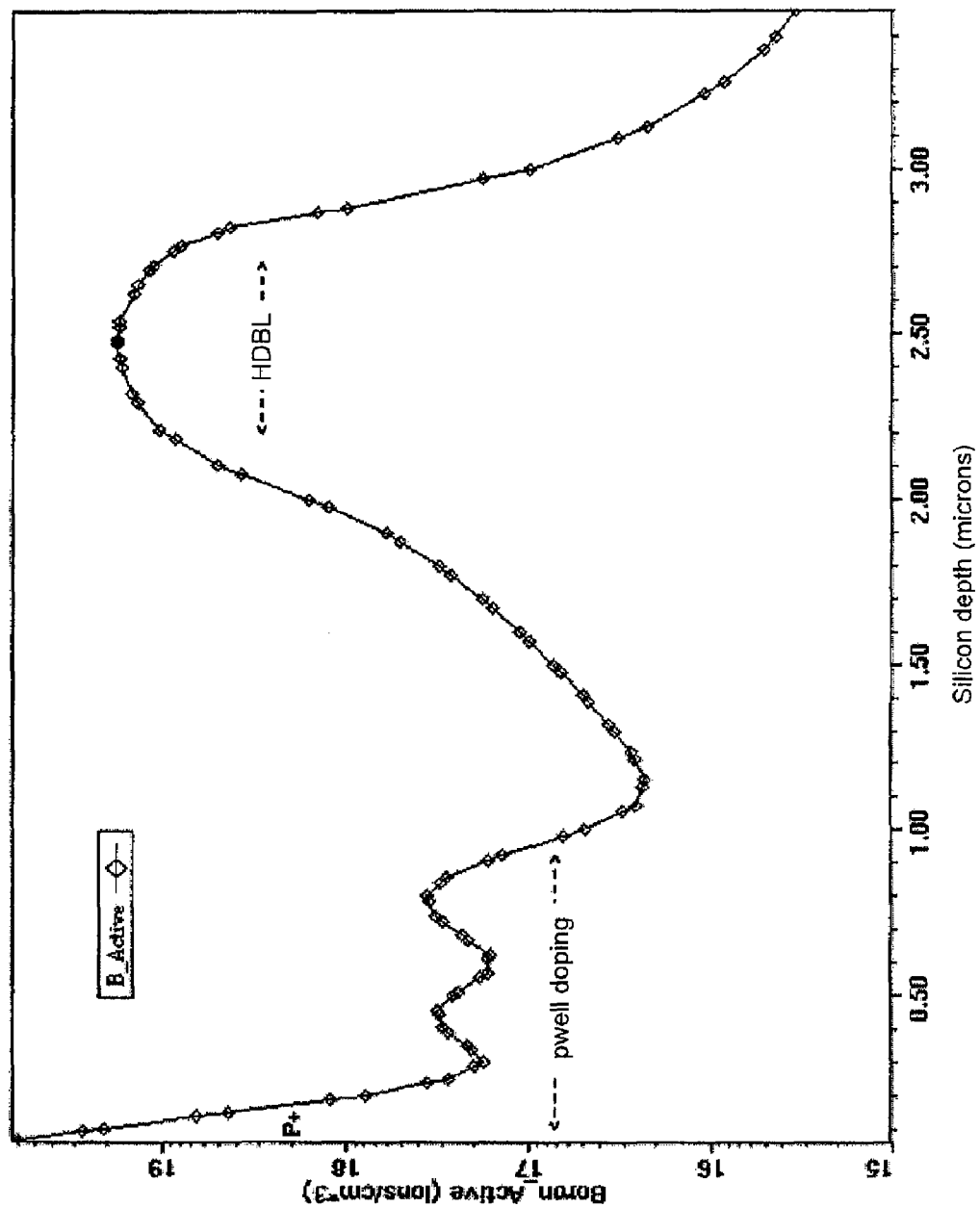

In the example of FIG. 3, HDBL layer 300 is a heavily doped region of the same conductivity type as the p– substrate, and is placed beneath the active device regions of the device by ion implantation. In general, both the doping and damage characteristics of HDBL influence device performance. HDBL structures are easily integrated into standard CMOS processing with the addition of typical steps such as, an implant step, a rapid thermal anneal (RTA), and an optional cleaning step in between the implant and anneal. The process steps associated with the HDBL can be performed either before or after dielectric isolation ($SiO_2$) formation either by LOCOS or the use of a shallow trench isolation (STI) structure common in many CMOS processes. While a variety of different impurities can be used, the most common implants are boron implanted at 1.0-2.5 MeV (for p-type substrates), and phosphorus at 1.5-3.5 MeV (for n-type substrates). If a wafer-normal to ion implant beam angle of zero degrees is set during ion implantation, the necessary energy to achieve a desired depth of the ion implant can be significantly reduced. Implanted doses typically vary between $1 \times 10^{13}$ and $5 \times 10^{15}$ $cm^{-2}$, which forms a highly doped and abrupt layer approximately 1.0-5.0 μm below the silicon surface. The buried layer peak doping concentration can range from $1 \times 10^{17}$ $cm^{-3}$ to $5 \times 10^{21}$ $cm^{-3}$. The buried layer is typically implanted sufficiently deep so that the final dopant profile (after all thermal processes) does not counterdope the retrograde well of opposite conductivity, which results in low well-substrate breakdown voltage. For example, a CMOS twin well process includes an HDBL structure (i.e., boron with an implant energy of 1.7 MeV and a dose of $1 \times 10^{15}$ $cm^{-2}$ forming a blanket p+ buried layer). The 1-D doping profiles after all thermal processing steps are completed are shown for the p+/n-well region and the $V_{SS}$ tie region in FIGS. 12 and 13, respectively.

For example, in the case of FIG. 3 where the substrate is p– doped, the deep p+ layer provides a low resistance shunt 300 that significantly reduces the series resistance between the pnp subcollector (below the n-well) and the p+ collector ($V_{SS}$). Forming a p+ shunting layer 300 via implantation also gives circuit designers the option of patterning the implant to independently optimize substrate resistivities in different areas, e.g., for a system-on-chip design. Thus, substrate resistors $R_{S1}$ and $R_{S2}$ are now significantly reduced, typically by more than two orders of magnitude, because of the presence of HDBL 300. The spreading resistance of the region can be lowered to less than 50Ω as compared to 2 kΩ or more for conventional CMOS isolation. However, use of the HDBL alone does not effect other parasitic resistances such as $R_{S3}$ and $R_{PW1}$. Consequently, significant vertical resistance continues to exist.

A second step in addressing latch-up and other substrate current transients is to reduce the significant vertical resistance. Addition of a vertical conductor 310 extending between the buried layer 300 and a p-well contact region (as shown) or some other substrate surface terminal significantly reduces this resistance. In one embodiment, the vertical conductor 310 is formed as a vertical impurity region having the same conductivity type as the substrate, but typically having an impurity concentration greater than that of the substrate. For example, where the substrate is a p– substrate, vertical conductor 310 can be formed from one or more p+ implants into the region extending between p-well contact 320 and buried layer 300. High-energy ion-implantation combined with photoresist masking and/or multiple energy implantation can provide a vertical p+ doped region with high aspect ratio doping profile to bridge the uplink path from an ohmic $V_{SS}$ surface contact or Schottky diode to buried layer 300 or other p+ bulk layers as is typical for p– epi on p+ bulk substrates. For example, in one implementation vertical conductor 310 is formed by multiple ion-implant steps at one or more energy levels.

When buried layer 300 and vertical conductor 310 are used in conjunction with each other, a new structure referred to as a buried guard ring (BGR) is formed. The BGR offers several isolation attributes. Since the low resistance deep buried layer is now locally connected via a vertical doping region or other conductor: (1) minimum impedance is provided for most or all of the accumulated, deposited or injected charge occurring within the silicon substrate region; (2) transient times for charge termination are reduced thereby improving overall isolation by reducing or minimizing the duration of any n+/p– diode forward biasing which reduces injected currents; (3) the BGR forms a low-resistance circuit leg back to the p-well contact terminal, thereby creating a current divider which effectively shunts and sinks a majority of any injected or deposited current away from the $R_{S4}$ and $R_{S5}$ resistor legs, thereby significantly reducing base current feedback to the parasitic npn devices shown and limiting voltage transients for the p-bulk silicon region associated with the CMOS structure. The BGR structure, by effectively shunting injected current or stray charge promptly to the $V_{SS}$ terminal, reduces or prevents voltage transients which could subsequently forward bias either or both of the n–/p– diodes (n-well/p-substrate diode inherent in CMOS twin well isolation) and the n+/p– diodes (inherent in NMOS transistor) and eliminates subsequent triggering of the pnpn SCR network. Latch-up with the BGR isolation structure present then becomes difficult or impossible to initiate, thereby preserving the circuit from ever entering destructive latch-up.

Figure 4:
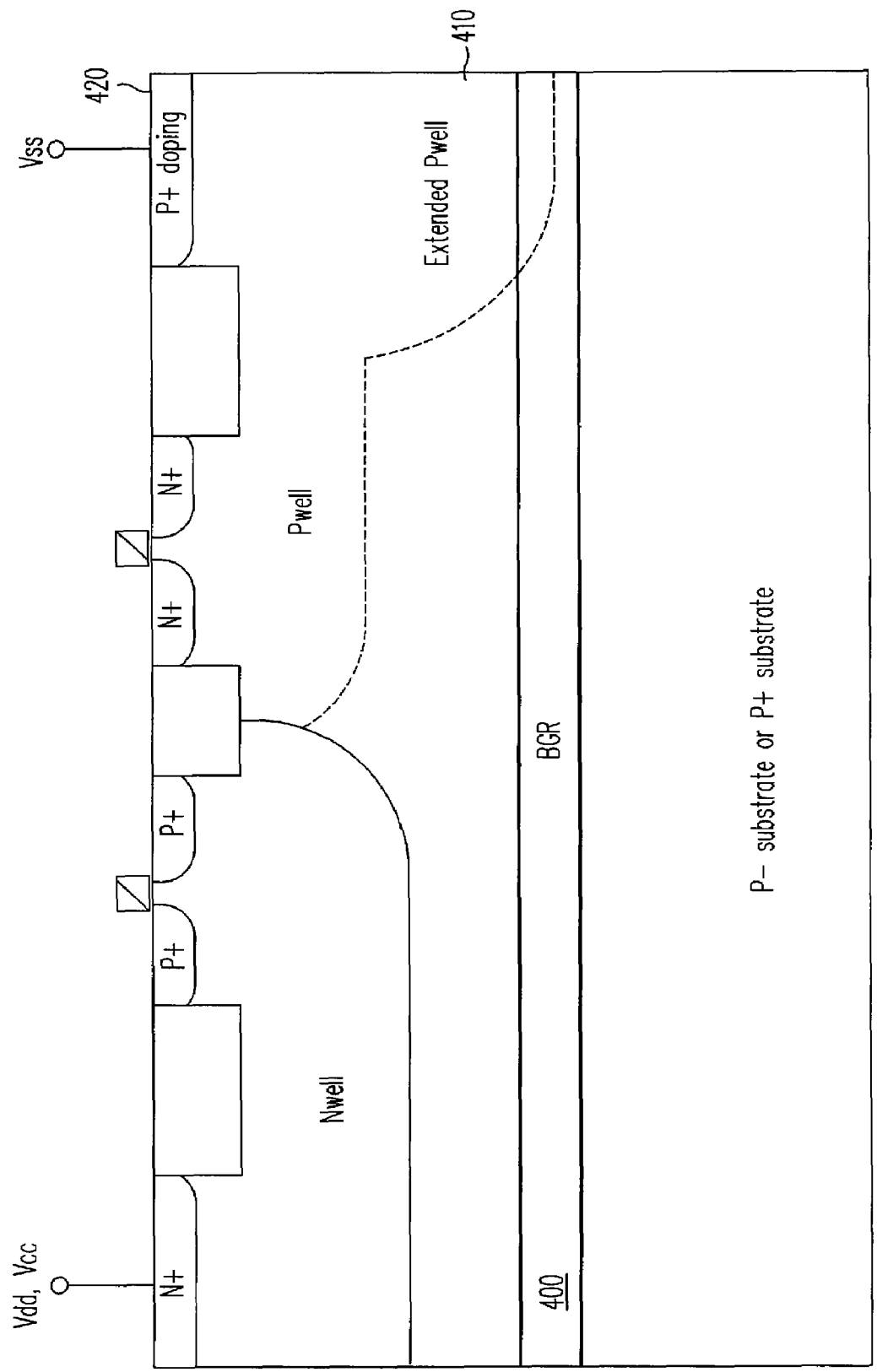
FIG. 4 illustrates a simplified block diagram of an inverter structure utilizing additional techniques and devices of the present invention.

FIG. 4 illustrates and alternate implementation of the BGR structure. In this example, buried layer 400 is connected to p-well contact 420 using an extended p-well area 410 as the vertical conductor. Such an approach can potentially simplify device fabrication by making formation of the vertical conductor part of the normal p-well implant (or diffusion) process. Since the typical depth of buried layer 400 is from 1 to 5 μm, the p-well formation technique used should be capable of providing an adequately deep extended p-well. Moreover, extended p-well area 410 will typically extend well into buried layer 400 to ensure proper electrical contact.

In still other examples, the vertical conductor could be formed much the way vias or other vertical conductors are formed. For example, a deep trench that terminates at or near the top of a buried layer could be used. With appropriate spacer formation, silicide formation, and filling with polysilicon or metal, such a conductor could extend to the substrate surface where it would be capped in a conventional manner and terminated as appropriate in a metallization scheme. Conductor formation can also utilize emerging technologies, such as atomic layer deposition (ALD), or any other techniques as are well known by those having skill in the art.

Figure 5:
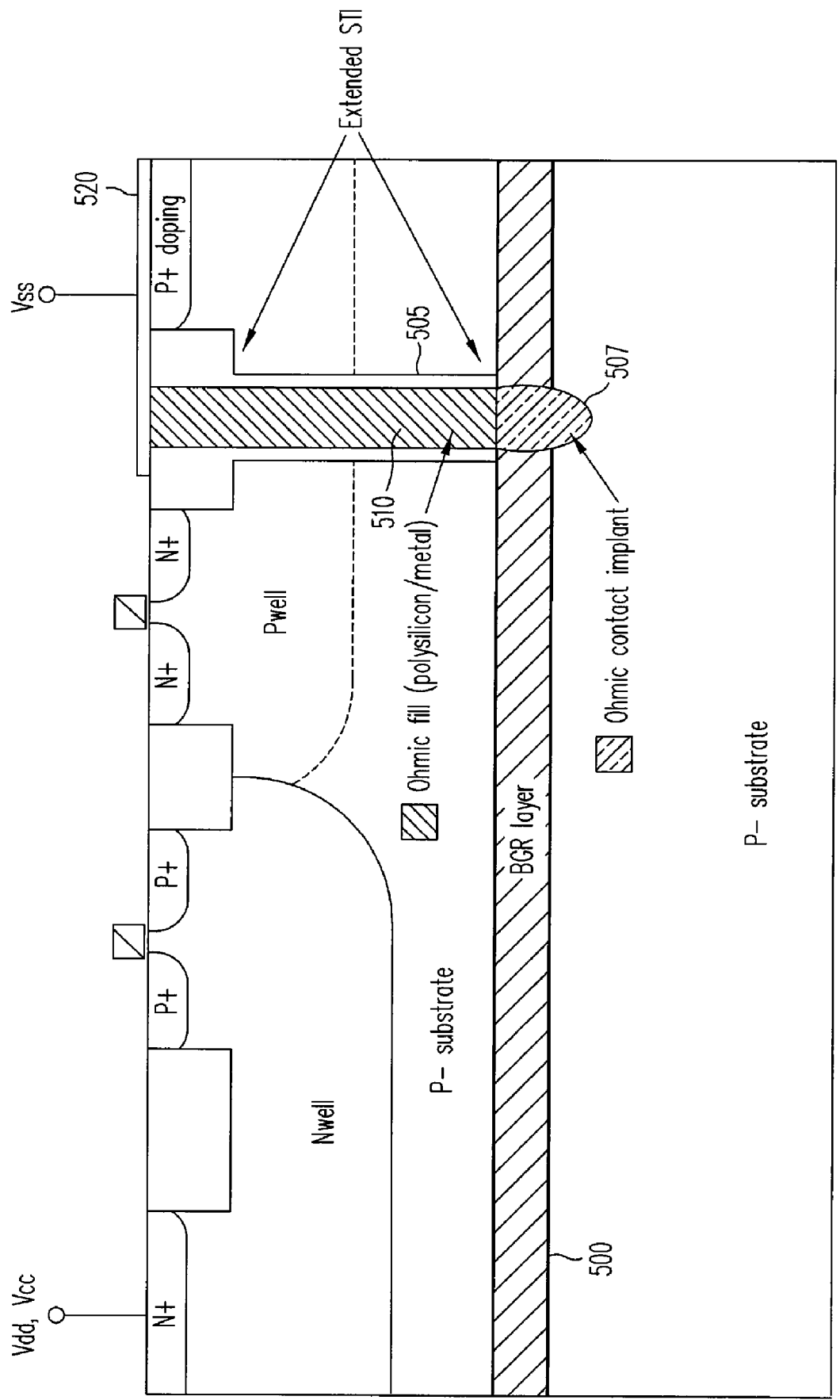
FIG. 5 illustrates a simplified block diagram of an inverter structure utilizing still other techniques and devices of the present invention.

FIG. 5 illustrates an example of direct connection using a metallization scheme to contact HDBL horizontal layer 500. In this example, shallow trench isolation (STI) structures are used to insulate the vertical conductor from the surrounding p-well and substrate. In a conventional STI structure, a shallow trench is etched into the substrate. The trench is then thermally oxidized and filled with a deposited oxide to make it non-conducting. Such a structure provides good isolation between adjacent MOS devices. However, in the example of FIG. 5, STI structure 505 is extended down to buried layer 500. Instead of filling the STI structure with an insulative material, STI structure 505 includes an ohmic fill (e.g., polysilicon and/or metal) to provide the needed vertical conductor 510. Electrical contact between vertical conductor 510 and buried layer 500 can be further enhanced using an ohmic contact implant 507. Ohmic contact implant 507 is typically an ion implant extending from the bottom of the STI trench well into the buried layer. P-well contact 520 is formed so as to be electrically coupled to vertical conductor 510.

Figure 6A:
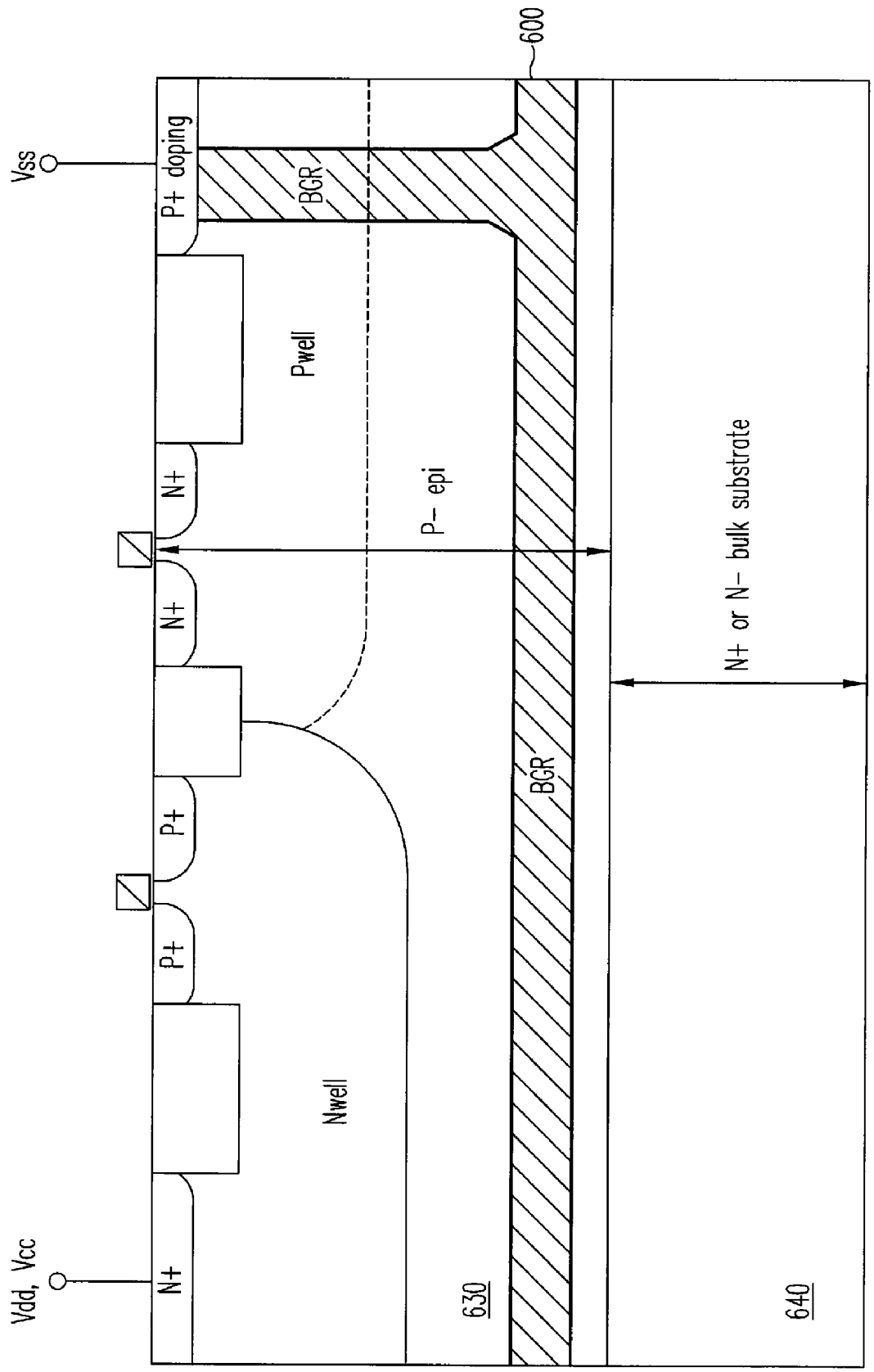
FIGS. 6A-6B illustrate additional embodiments of the structure illustrated in FIG. 3.
Figure 6B:
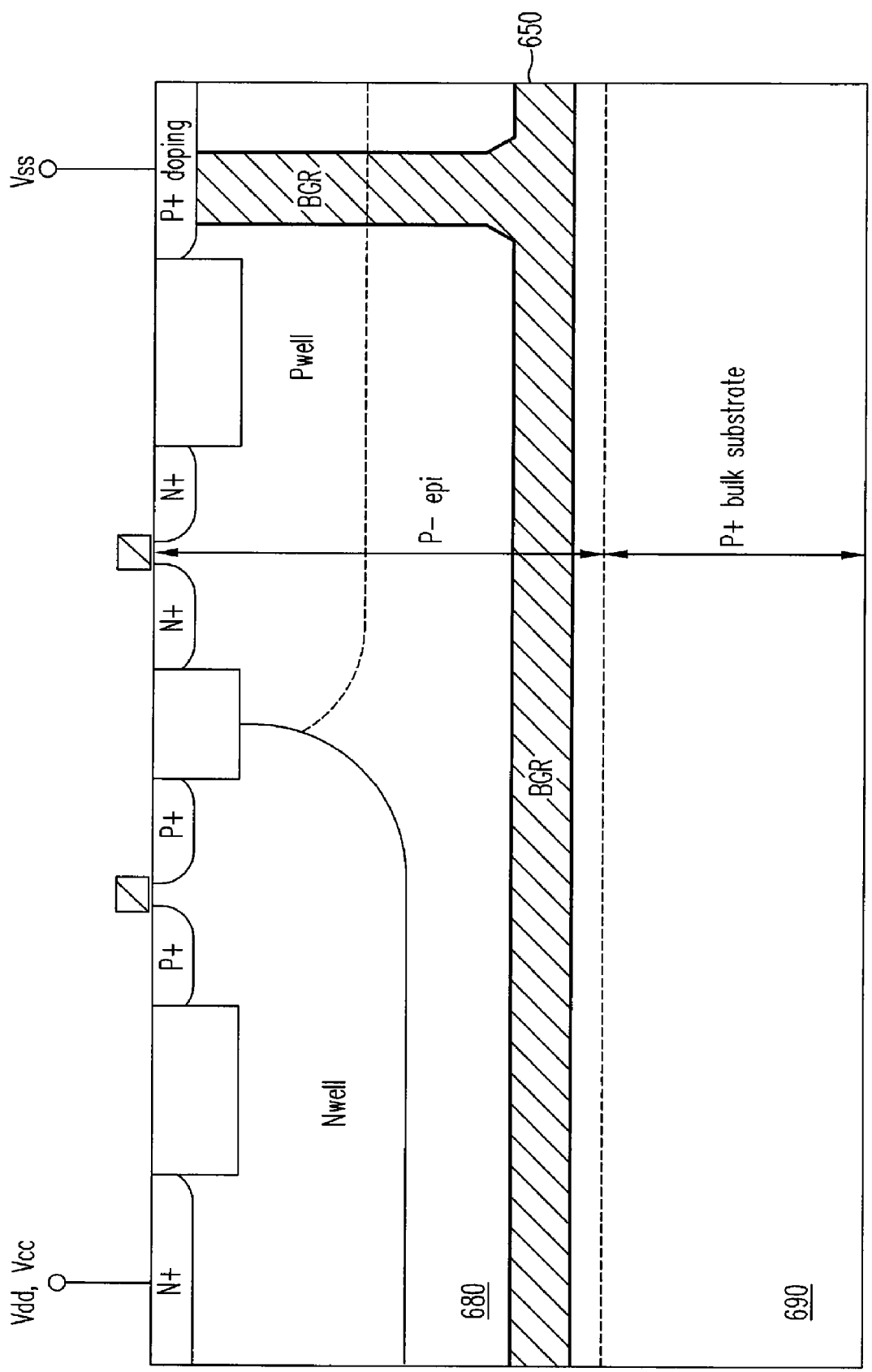

FIGS. 6A-6B illustrate other implementations of the BGR structure. In FIG. 6A, BGR structure 600 (formed using any of the structures/techniques described above) and the CMOS inverter are formed in p– epitaxial layer 630 which in turn is formed on n+ or n– bulk substrate 640. As will be well known to those having ordinary skill in the art, various different techniques can be used to form epitaxial layer 630. Similarly, FIG. 6B illustrates a BGR structure 650 (again, formed using any of the structures/techniques described above) formed along with the CMOS inverter in p– epitaxial layer 680. Epitaxial layer 680 is in turn formed on p+ bulk substrate 690.

Figure 7A:
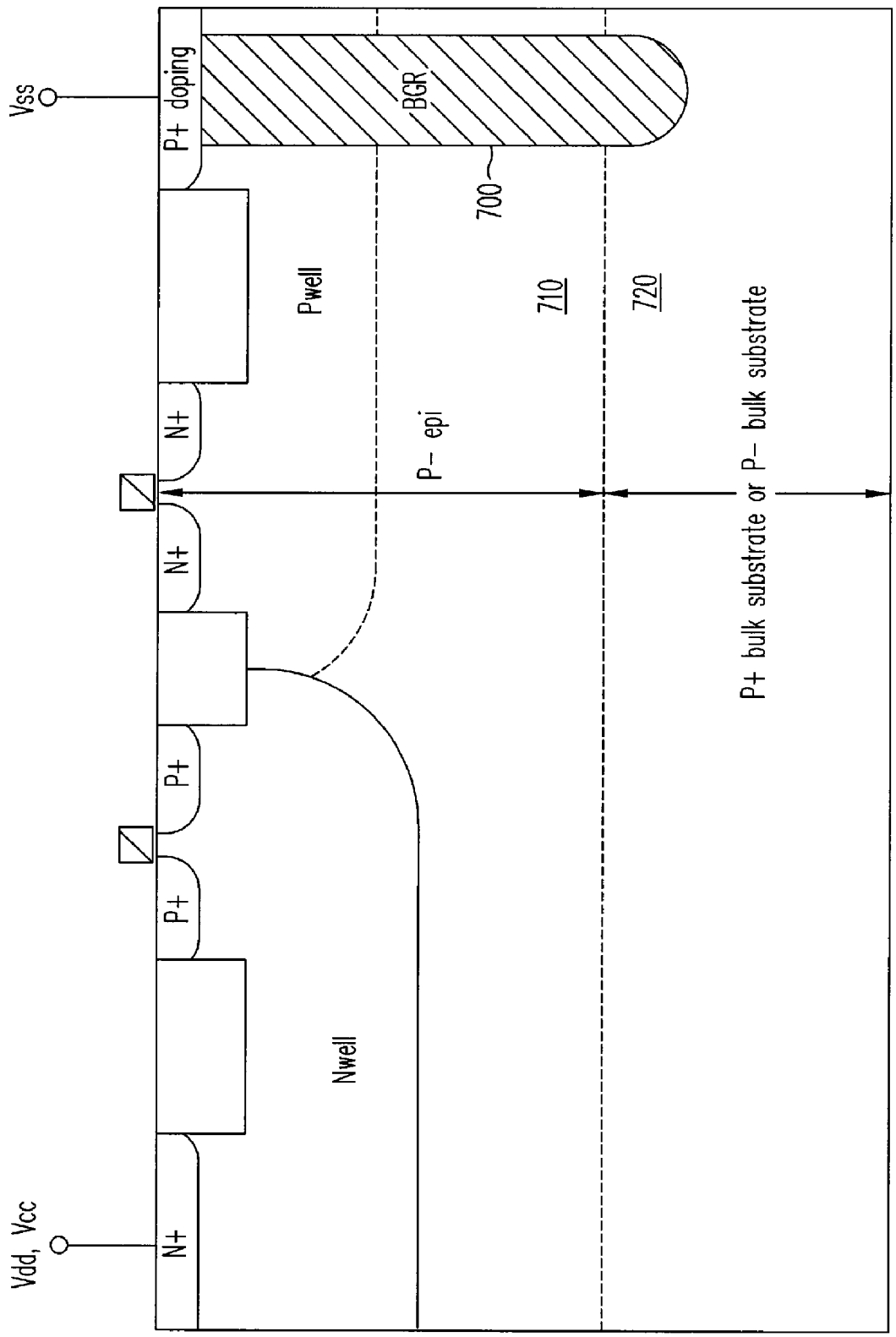
FIGS. 7A-7C illustrate other embodiments of the present invention.
Figure 7B:
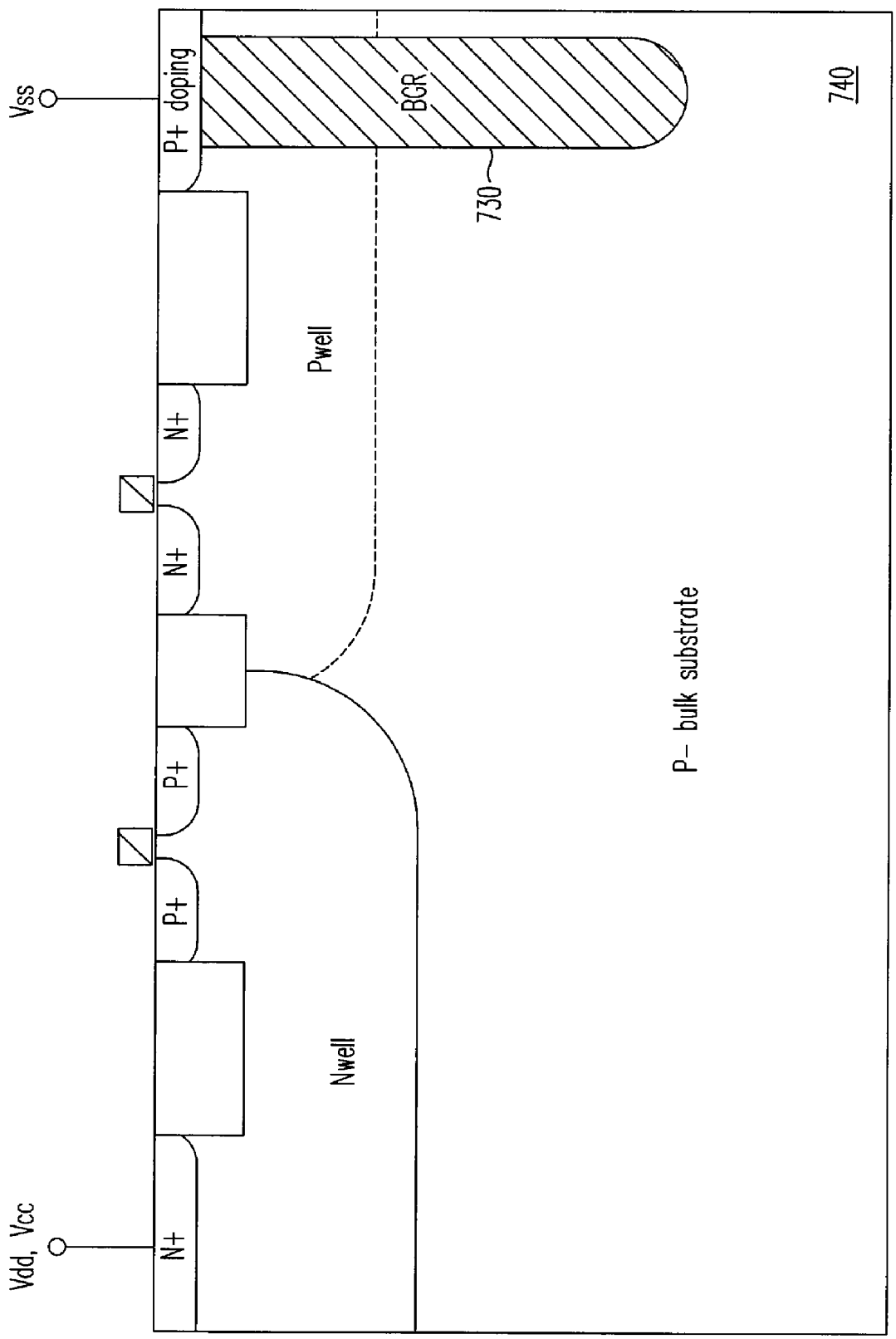
Figure 7C:
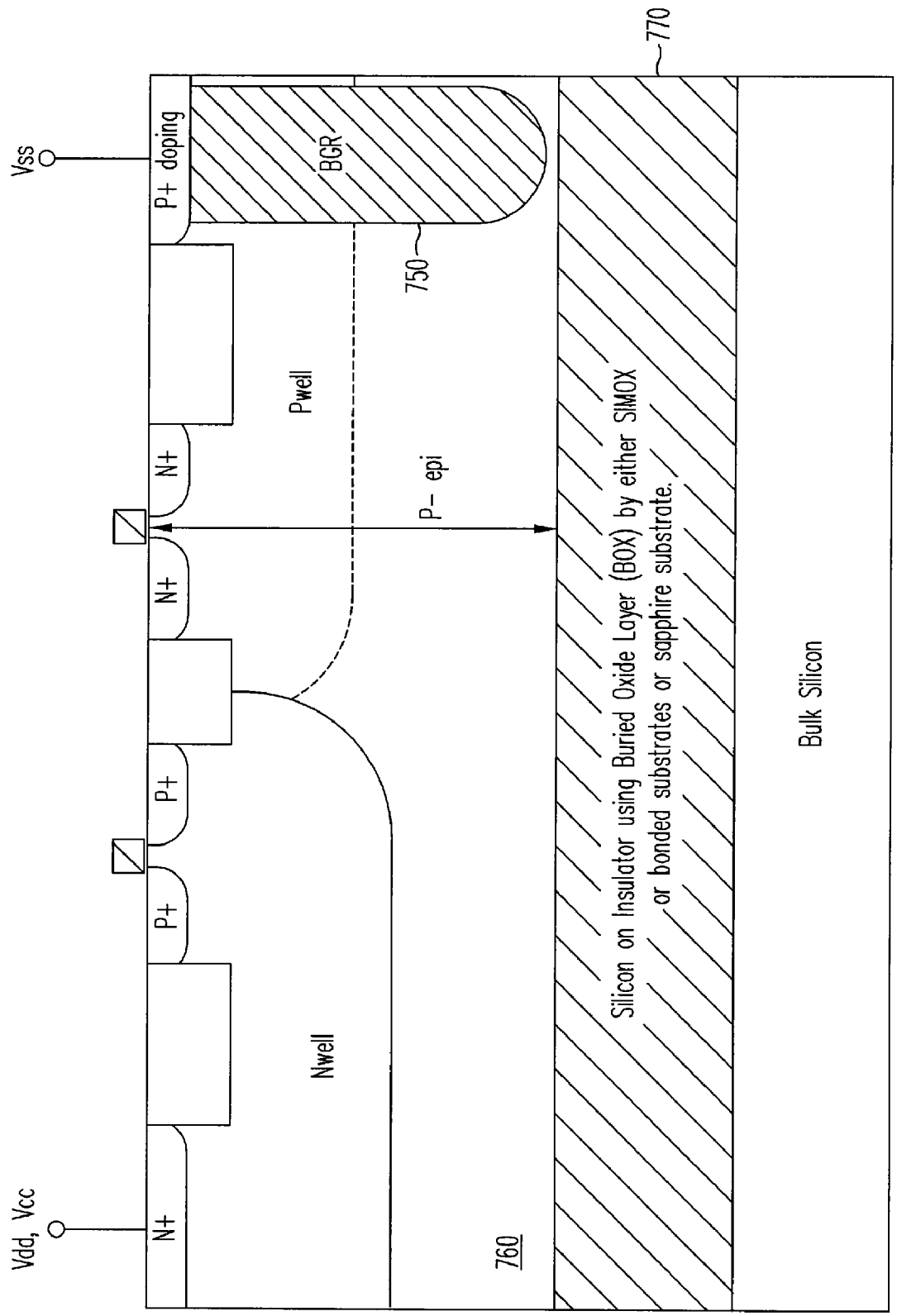

FIGS. 7A-7C illustrate still other embodiments and variations of the basic BGR structure. As shown in FIG. 7A, the BGR structure includes only a vertical conductor 700 (e.g., a vertical doping structure, deposited conductor, etc.), and does not include the HDBL described above. Such an implementation can provide adequate device benefits in some cases, particularly where the CMOS devices are very closely formed, such as in an SRAM implementation. In this example, BGR structure 700 extends to the p+ or p– bulk silicon substrate 720 while passing through p– epi layer 710, as would be used, for example, in a p– epi on p+ bulk wafer. Epitaxial layer 710 is in turn formed on substrate 720 and contacted using only the vertical BGR extension 700. FIG. 7B illustrates a similar implementation, where vertical BGR component 730 is implemented into p− bulk silicon. Similarly, FIG. 7C shows an implementation where vertical BGR component 750 is formed in an epi layer 760 which in turn has beneath it a buried oxide layer 770 (or other SOI implementation) formed using well known SOI techniques.

Figure 8A:
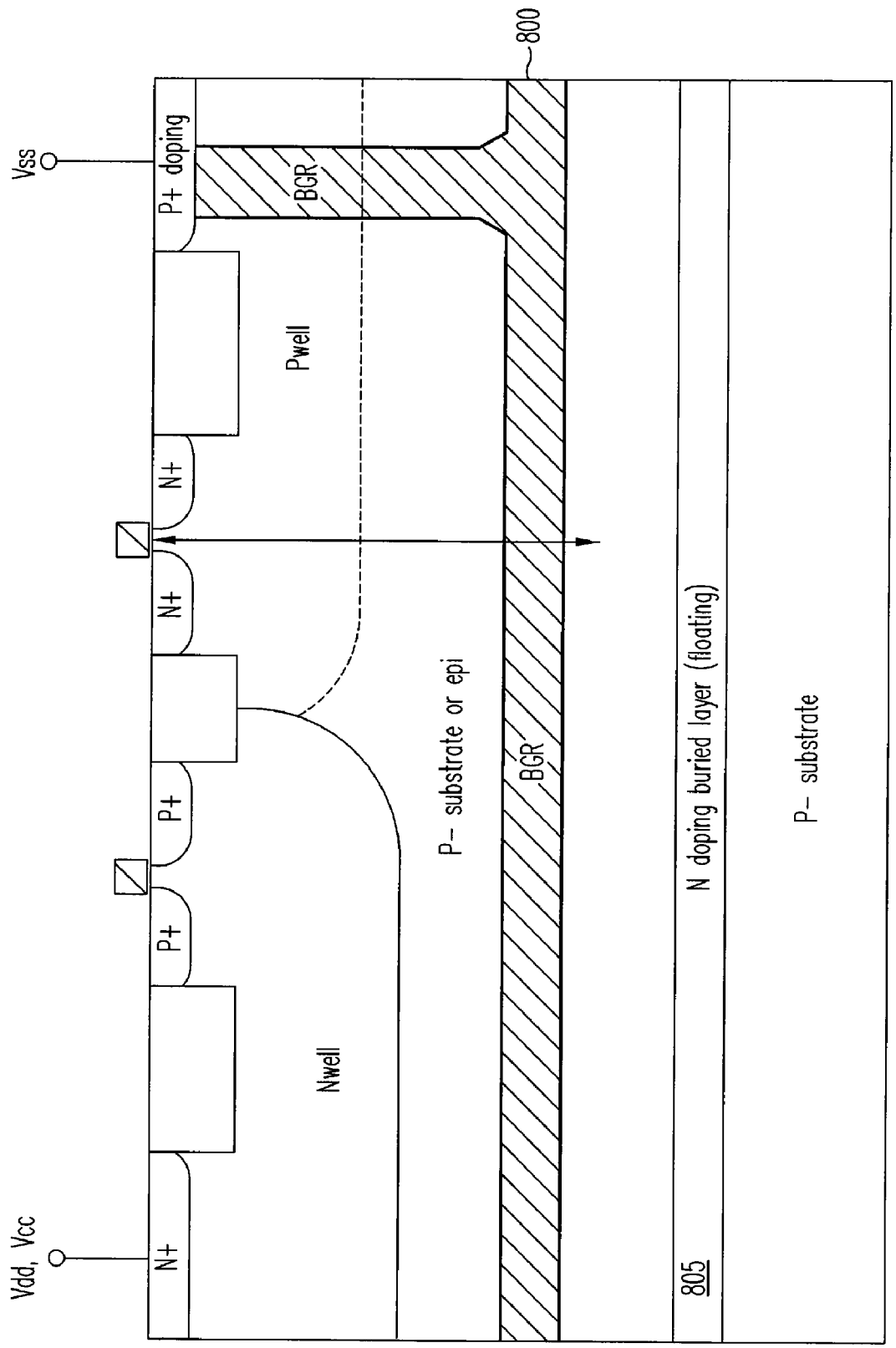
FIGS. 8A-8E illustrate still other embodiments of the present invention.

FIGS. 8A-8E illustrate still other embodiments and variations of the basic BGR structure. As shown in FIG. 8A, BGR structure 800 and a corresponding CMOS inverter have the same basic structure as that illustrated in FIG. 3. Note that in this example, as well as the examples of FIGS. 8B-8E, the BGR structure can in general be formed using any of the structures/techniques described above. However, an n-type doping layer 805 is included beneath the buried layer portion of BGR 800 to act as a carrier recombination and/or gettering layer. Layer 805 is typically left floating, i.e., it is not electrically coupled to ground or some other reference voltage. However, in other implementations, layer 805 can be coupled to a suitable potential. N-doped layer 805 can be formed using any number of implant or diffusion techniques, as will be well known to those having ordinary skill in the art.

Figure 8B:
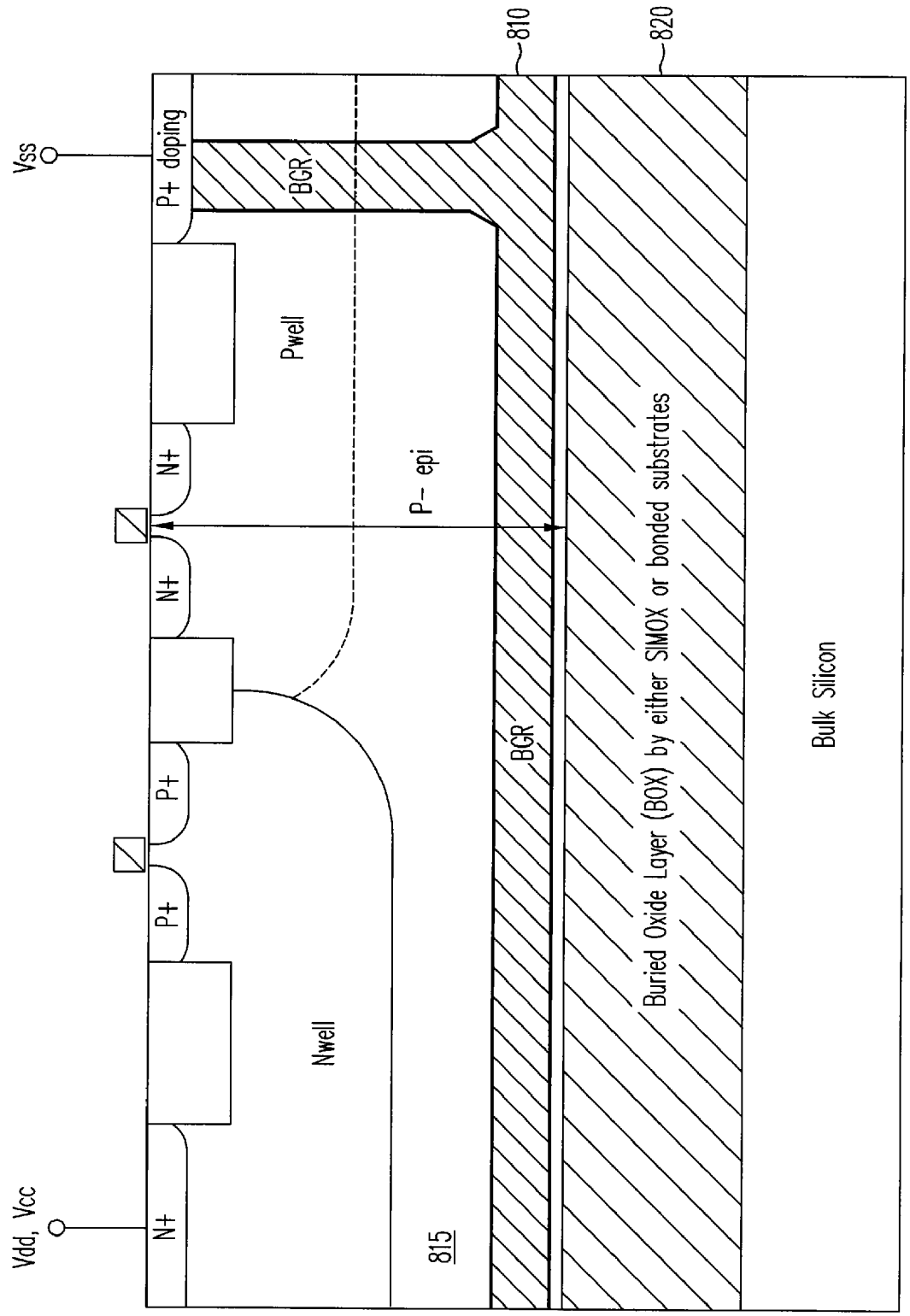

As shown in FIG. 8B, devices using the BGR structure can implemented in silicon on insulator (SOI) substrates in order to take advantage of the unique properties of such substrates. In this example, BGR structure 810 and its associated CMOS devices are formed in epitaxial layer 815. Buried oxide layer 820 is formed in (e.g., using a separation by implantation of oxygen (SIMOX) process) or on (e.g., using a bonded wafer process) the bulk silicon wafer. Thus, BGR devices can further take advantage of the beneficial properties of SOI wafers including: reduced parasitic capacitance, additional SEU immunity, and in some cases simplified processing.

Figure 8C:
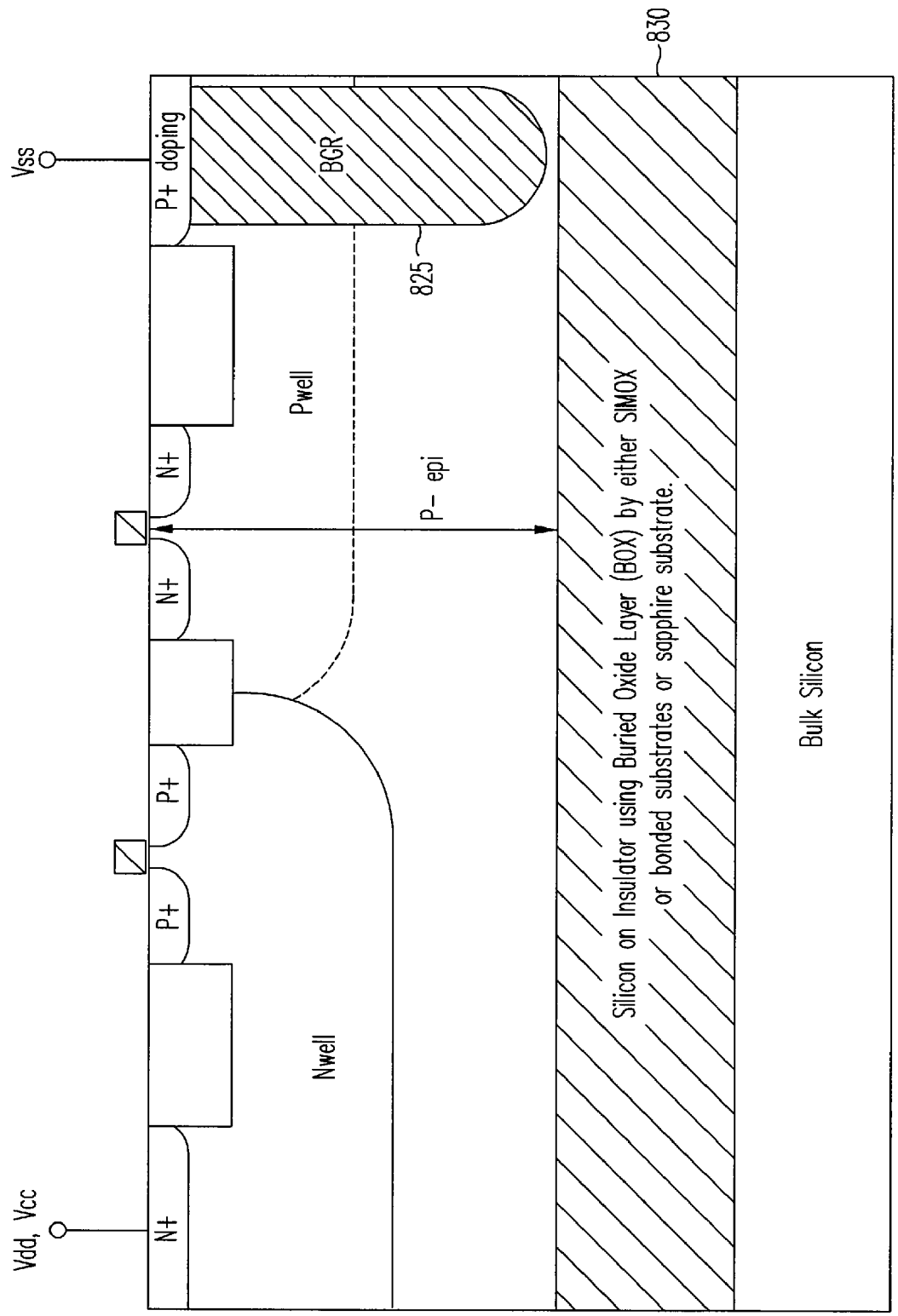

FIG. 8C illustrates an embodiment similar to that of FIG. 8B. However, in this case BGR structure 825 is formed from a single vertical conductive component as described above. BGR structure 825 typically extends through the epi layer to approximately the depth of buried oxide layer 830. In some embodiments, BGR structure 825 can stop well short of, or extend into buried oxide layer 830.

Figure 8D:
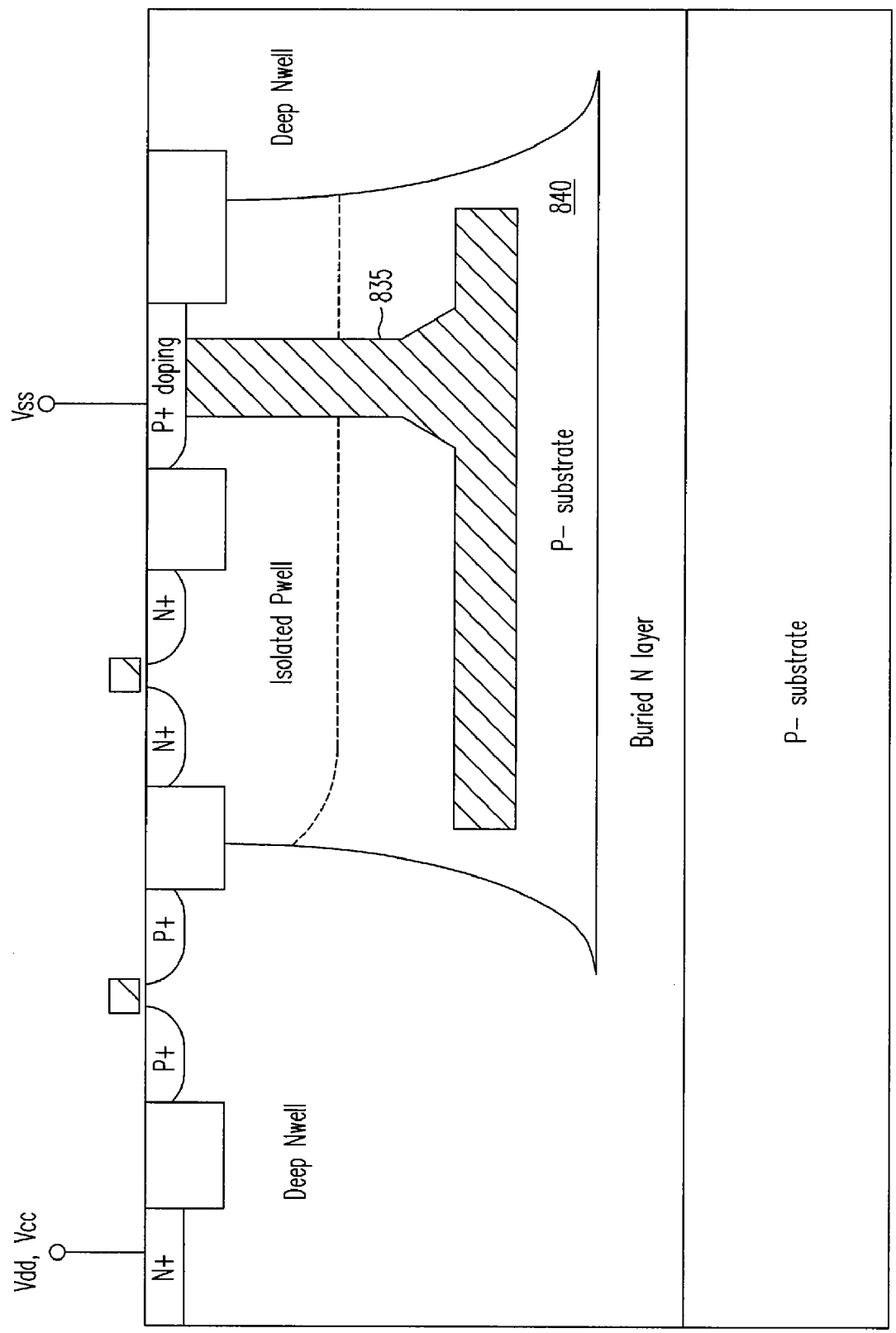

FIG. 8D illustrates still another example where the BGR structure is used with a CMOS device that includes triple well isolation, common for many RF devices. Here, BGR structure 835 is formed within the p− substrate region 840 of the isolated p-well common to triple well isolation implementations, but still surrounded (on the sides) by the deep n-well structures and (below) by a buried n-layer used to provide the additional isolation.

Figure 8E:
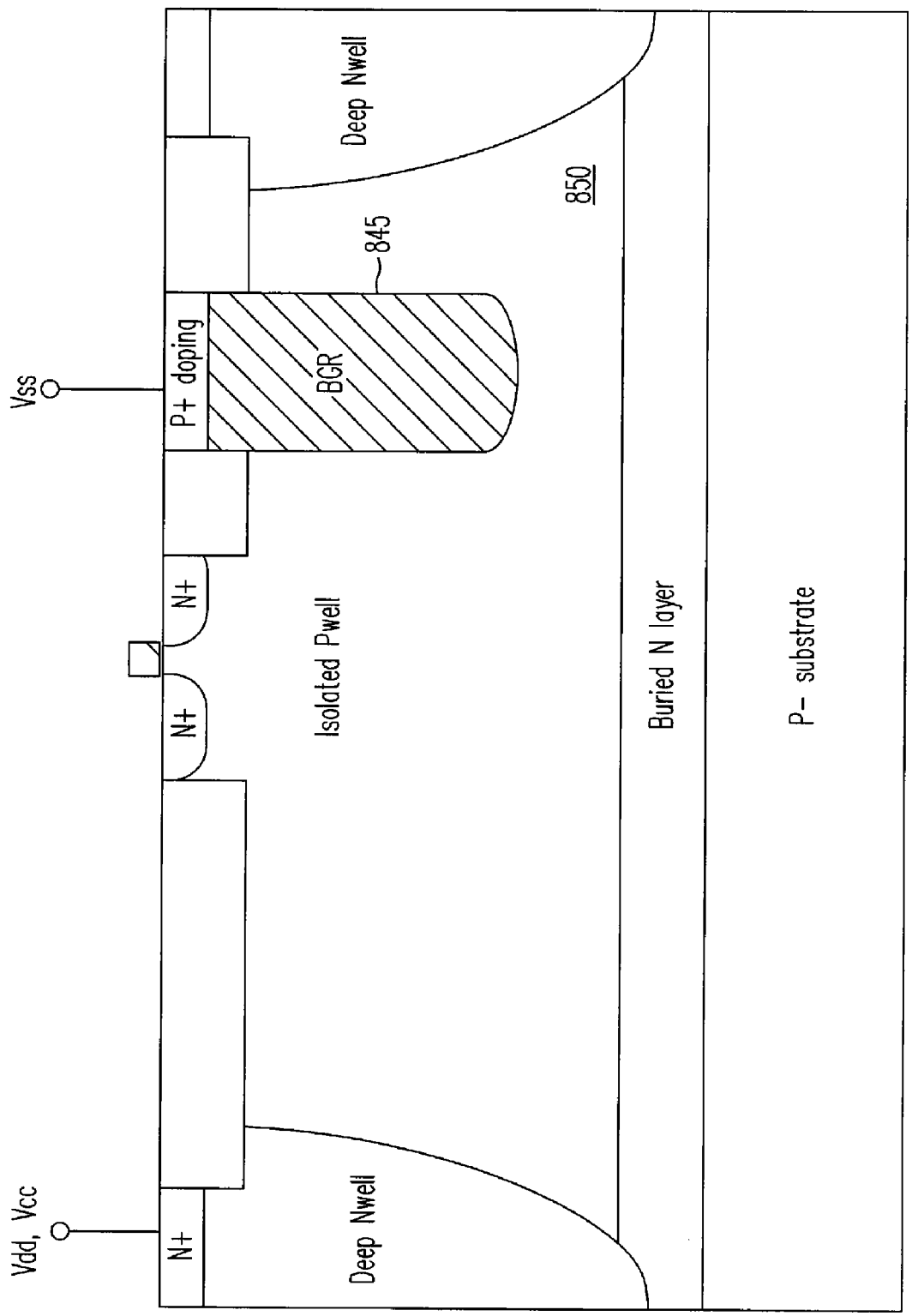

Finally, FIG. 8E illustrates still another BGR embodiment where BGR structure 845 is formed from a single vertical conducting structure and no HDBL. BGR structure 845 is implemented in the isolated p-well 850 of the triple well isolation structure. The final depth of the vertical BGR layer is consistent with the depth of the isolated p-well region and is typically less than 2 microns.

Figure 9A:
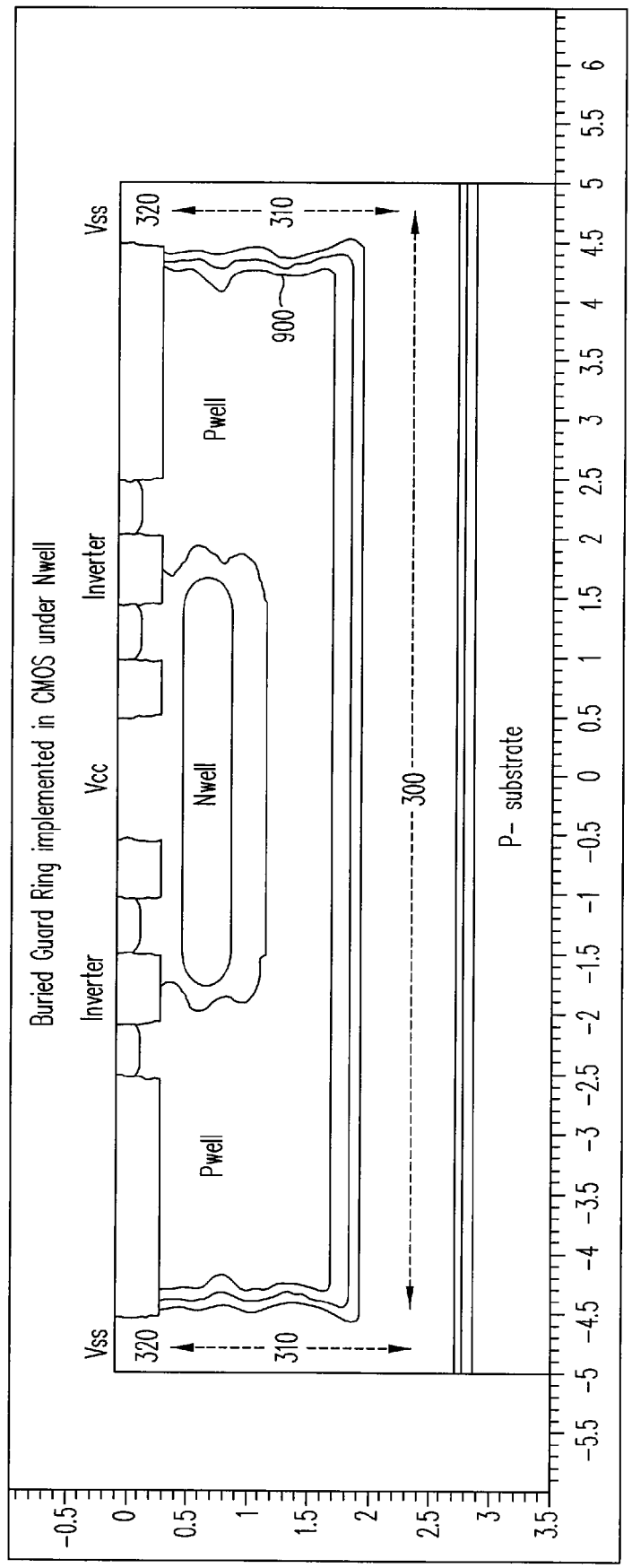
FIGS. 9A-9C illustrate 2D and 1D simulations of the doping profiles of structures utilizing several of the techniques of the present invention.
Figure 9B:
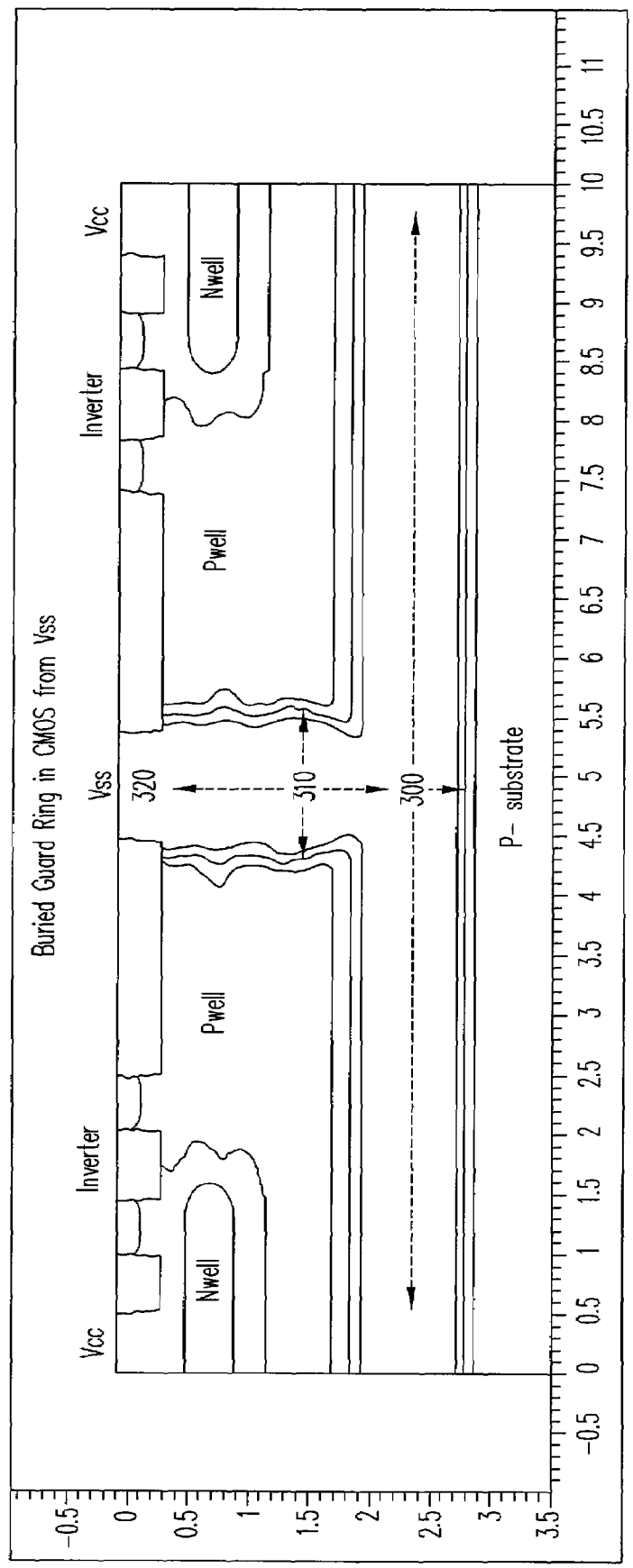
Figure 9C:
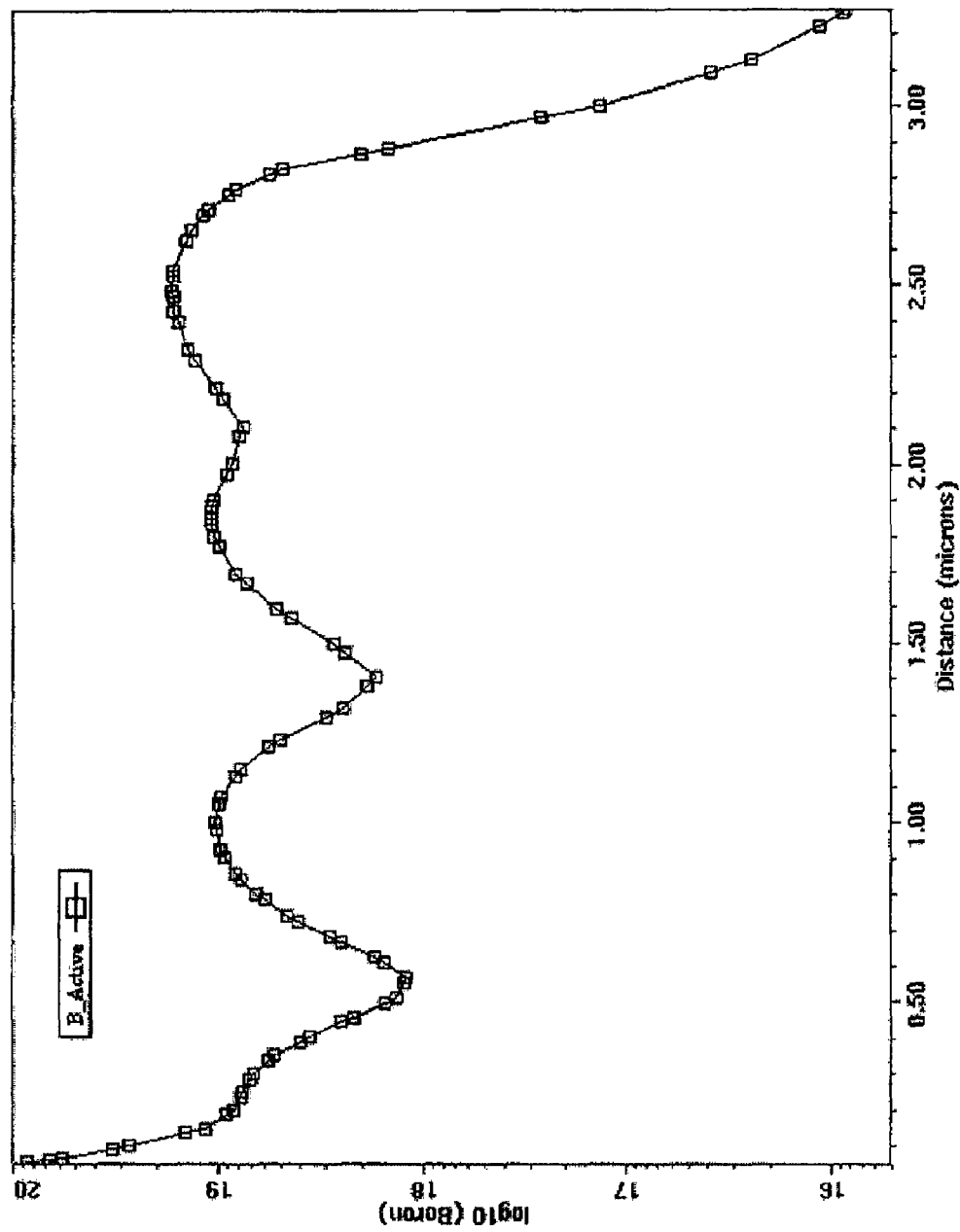

FIGS. 9A-9B illustrate a 2D simulation (using the Taurus-Medici device simulation tool from Synopsys, Inc.) of the doping profile of a CMOS twin well structure with the heavily p+ doped region now extending below the $V_{SS}$ terminal to the p+ buried layer. FIG. 9A shows the BGR structure emphasizing its connection to the $V_{SS}$ terminal, while FIG. 9B illustrates portions of the BGR structure under the device n-well. Contour 900 shows the $1\times10^{18}$ cm$^{-3}$ doping contour generally indicating the region of p+ doping that forms the BGR. Reference numbers 300, 310, and 320 show the buried layer, vertical conductor, and p-well contact 320 respectively. The impurity concentration of the BGR regions generally varies between $1\times10^{18}$ and $1\times10^{19}$ cm$^{-3}$. FIG. 9C shows a one-dimensional doping profile from $V_{SS}$ (i.e., below the p+ ohmic contact in the p-well) to the p+ buried layer. In general, the p+ vertical doping region is located only below the $V_{SS}$ terminal (the p-well connection region) so that it does not interfere with normal circuit operations. As will be described below in connection with FIG. 11, the improved contact to the HDBL shunt layer is shown to be extremely effective in preventing latch-up triggering.

Figure 10:
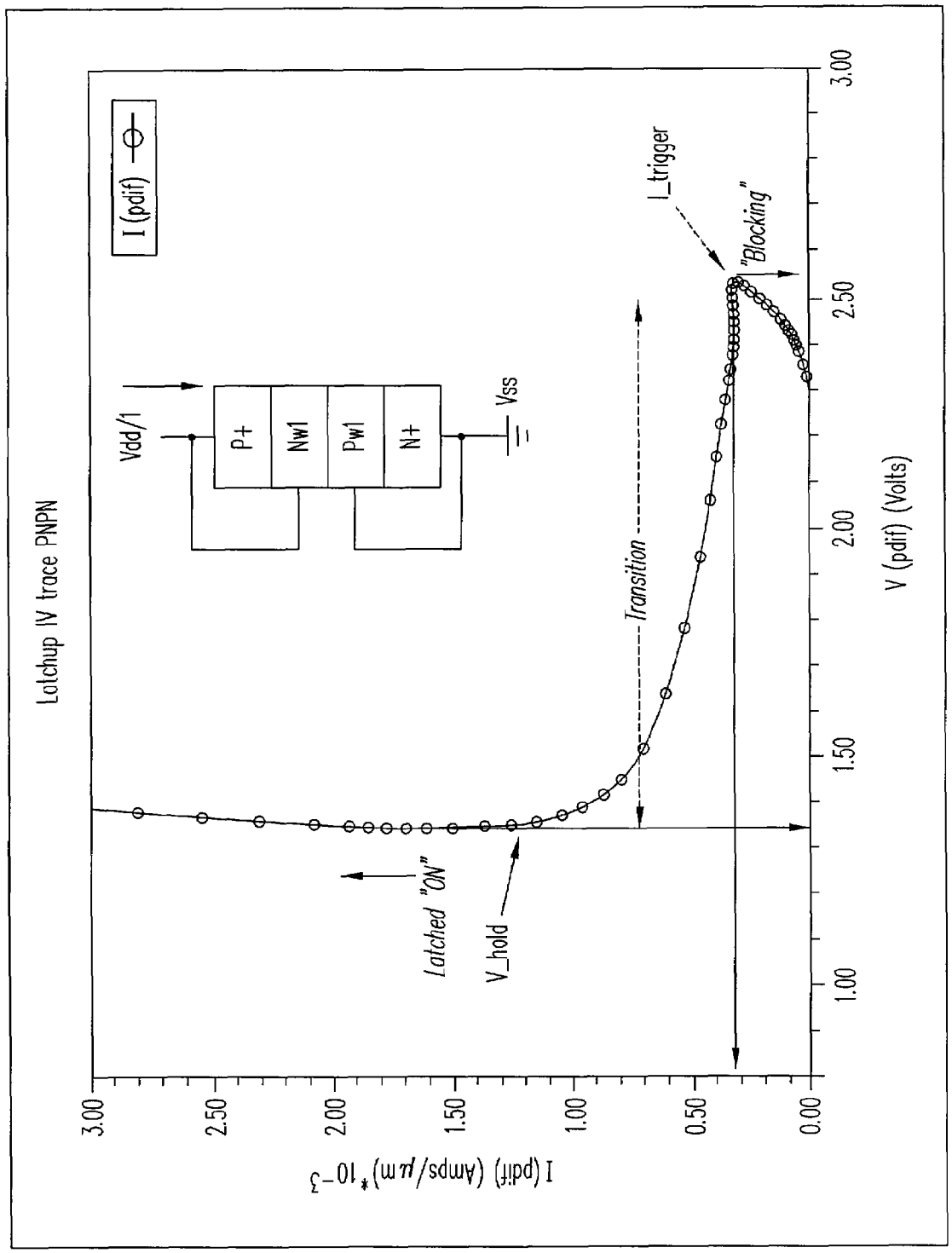
FIG. 10 provides a typical current vs. voltage (I-V) trace illustrating latch-up.

FIG. 10 provides a typical current vs. voltage (I-V) trace illustrating latch-up as well as terms and features normally used in conjunction with a latch-up I-V trace. In this example, the I-V characteristics of a p+ diffusion experiencing overvoltage are shown. The voltage at the p+ diffusion starts at $V_{DD}$ (1.5 V) and is ramped to higher voltage as would be the failure mode of an overvoltage condition. Since the p+ diffusion is diode isolated from the n-well, it can only block current up to the forward bias diode built-in potential of approximately +0.3 V before becoming active. For overvoltages greater than 0.3 V higher than $V_{DD}$, ($V_{BE}$) current is injected across the p+/n− emitter/base diode and collected in the base/collector junction. Once active, the pnp bipolar parasitic transistor actively injects current into the emitter base junction. The p+ emitter current is divided and flows to both the n-well base contact and the p+ collector (p-well). As the SCR trigger current is approached, pnp collector current is flowing to the $V_{DD}$ terminal within the n-well, and significant hole current is flowing to the $V_{SS}$ terminal which represents the pnp collector terminal. Note that prior to reaching the SCR trigger current, the n+/p− diode (which represents the emitter/base junction of the npn parasitic transistor) remains in the off state since, based on its local potential, it is still in a reversed biased blocking state.

If the overvoltage transient condition persists the vertical pnp (VPNP) will continue to inject holes into the p-substrate, which is terminated at the $V_{SS}$ (ground) body tie. The VPNP collector current quickly drives the local potential in the p-well up from zero volts to +0.3 V above $V_{SS}$, which then forward biases the n+/p− diode since the n+ diffusion potential is fixed at $V_{SS}$. This n+/p− diode, which has been inactive so far, now begins to inject electrons into the p− substrate as the potential of the p-well continues to increase. The electrons (minority carriers) injected into the p-well will be collected at the CMOS n-well, since this is the highest available local potential node. The n-well is now acting as an npn sub-collector. The lateral npn (LNPN) collector current now provides significant current to the n-well base of the VPNP. LNPN collector current flows across n-well series resistors (FIG. 3). NPN collector current now flowing in the n-well forces an additional potential drop within the n-well (at the p+ diffusion) to some voltage below $V_{DD}$. The point on the I-V plot in FIG. 10 that marks the transition of the pnpn from the high impedance (blocking) state to the negative differential resistance state is called the trigger current. Trigger current is a meaningful term by which to judge latchup resistance capability since it is a measure of the current necessary to shift the "net potential" of the two independent diodes by +0.7 V. It is always desirable that the trigger current be as high as possible to prevent the pnpn from forward biasing to the low impedance non-blocking state.

A transitional phase or negative resistance occurs once the trigger point is passed and the pnpn network transitions from the low current blocking state to the high current, low impedance state. Finally, the I-V curve reaches its minimum voltage value (vertical portion of FIG. 10). Just after the trigger point is passed, the current flowing between the two voltage rails ($V_{DD}$ and $V_{SS}$) moves from the substrate and n-well resistor to the surface, where the resistance is lowest. Even though the sheet resistances of the n-well and p-well regions along the edges of the STI are high, the spatial separation between the p+ diffusion ($V_{DD}$) and the n+ diffusions ($V_{SS}$) is small. The current flowing between $V_{DD}$ and $V_{SS}$ has now reached the lowest network resistance, and the associated voltage drop also reaches its minimum value. The aforementioned shunt resistors determine how much current is retained in the network resistor legs, and any current remaining here is subtracted from the base currents of the VPNP and LNPN, decoupling the bipolar effectiveness. Latch-up that reaches this saturation stage will cause overheating and can melt both the silicon and metal regions from the heat generated by the large currents being passed. The holding voltage is the minimum voltage for which positive current feedback can be sustained by the VPNP and LNPN pair.

Figure 11:
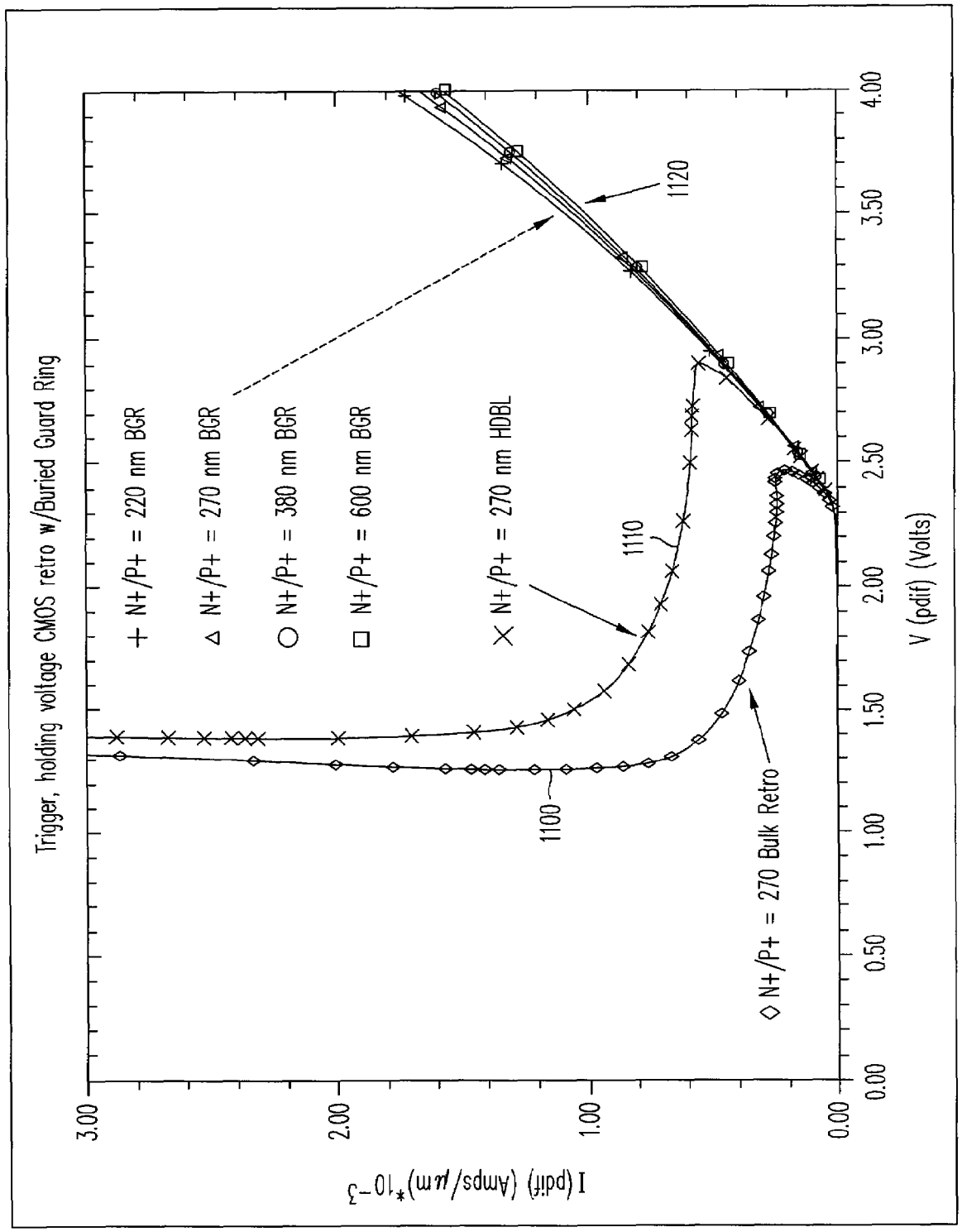
FIG. 11 illustrates I-V traces showing latch-up improvement associated with several of the techniques of the present invention.

With this in mind, FIG. 11 illustrates the significant improvements made possible when BGR techniques are applied to a conventional CMOS isolation scheme. Several curves are illustrated. The lower curve 1100 is a typical latch up I-V trace for an advanced CMOS technology with advanced n+/p+ spacing of 270 nm. The I-V trace shows that snap-back (latch-up failure) has occurred at approximately 200 µA/µm, and the latch up holding voltage is approximately 1.2 V. The second curve 1110 shows marked improvement associated with the presence of an HDBL, with snap-back now >500 µA/µm and holding voltage approximately 1.4 V. However in both cases latch up has occurred with a holding voltage that is below the power supply of 1.5 V. The remaining curves 1120 which represent IV characterization in the presence of a BGR structure show that no triggering event has occurred for even smaller n+/p+ spacing of 220 nm and with over voltage currents>1.6 mA/µA/µm. The lack of latch-up snap-back at these currents marks an improvement of more than 3 orders of magnitude. The simulation data shows the effectiveness of the BGR structure in preventing latch-up, even at extremely aggressive 220 nm n+/p+ spacing.

The three dimensional heavily doped BGR layers extend both horizontally and vertically thus creating low ohmic regions of contiguous and/or connected to isolation doping regions which stand separated from the transistor doping regions. As can be seen in FIGS. 3 and 9A-9B, the BGR structure can be integrated into any existing CMOS twin well isolation structure with no adverse impact to existing structures, thus enabling the improvements necessary to provide robust isolation for both conventional circuit noise initiated latch up and single event latch up. Moreover, BGR structures and techniques can be used to prevent latch-up in both radiation-hardened and conventional microelectronic circuits. BGR structures and techniques can also be implemented on a variety of different process variations, such as epitaxial silicon on bulk silicon (either with or without a heavily doped substrate), SOI, SOS, and the like.

The BGR structures and techniques can also be used to reduce or eliminate both single-event upset (SEU) and single-event transient (SET) events. SEU and SET can be caused by a high-energy particle, e.g., a single heavy ion or nuclear particle such as a neutron or alpha particle, passing through a critical node in an IC. Immediately after being struck by such a particle electrons and holes will be separated from the silicon lattice as a function of the particle's energy which is expressed as the linear energy transfer (LET Mev/mg-cm) of the particular particle. If the charge deposited and ultimately collected as free electrons and holes is greater than the critical charge of a memory cell or some other state-related device, a single-event upset can occur. The susceptibility of ICs to single-event upsets typically depends on the amount of critical charge required to "flip" a bit and the probability that a particle with a LET large enough to deposit that critical charge will strike a sensitive node. The production of large numbers of electron/hole charges also creates a potential dipole within the particle track passing through the silicon material. The Hall effect segregates the holes and electron charges to opposite sides of the electrostatic field. Some electrons and holes can recombine in the lattice via SRH and Auger mechanisms. However, as a result of their higher mobility, electrons are quickly collected at the positive terminals, whereas the net concentration of holes, which have lower mobility and remain with the silicon body as static charge while unrecombined because of depleted electrons. The positive charges cause the local potential of the p– substrate to increase in voltage to a positive value and continues to influence the local potential of the p– substrate positively for several nano-seconds after the high energy particle strike. As a result of the potential upset within the p– substrate, other unstruck diodes are now activated which creates secondary currents and enhances the initial upset more significantly, an effect often referred to as single event transient (SET). While soft error results in data corruption, it is not destructive to the physical circuit.

Since CMOS logic typically uses inverter gates and cross coupled logic gates to store binary bits in any digital circuit, the aforementioned BGR devices and techniques will prove useful in reducing SEU and SET. The BGR structure serves a similar role with regards to soft error as in the latch-up isolation. In both cases the BGR structure effectively sinks excess positive charge generated by the upset event, while maintaining node potential, and limiting the transient voltage swing and duration following an SEU, SEL, or SET event. Process and device simulations are used to quantify the effectiveness of the BGR structure using what is known as mixed-mode simulation. Test cases for SEU upset have been simulated for heavy ions (krypton) with LET of 110 Mev/mg-cm. In these simulations, where an inverter is brought to either a digital "one" state or a digital "zero" state and the mixed-mode SEU simulation is executed. In 21 different cases (21 different ion strike points, or angles of strike), the conventional CMOS inverter was shown to fail, i.e., an SEU occurred 9 times out of 21, or 43% of the time. In the simulations, the SEU charge transfer is completed within by 50 ps of the event, however the simulation was continued to 1 ns to observe charge recovery and circuit response.

Results from the same simulations using a CMOS inverter with a similar structure but now including the aforementioned BGR structure show marked improvement. In this example, there are no failures in the same 21 cases. While the BGR structure demonstrated no failure in 21 SEU tests, the contrast with the bulk silicon simulations is even more significant. In several cases of the BGR structure simulations, significant improvement both in voltage stability and transient response were seen. The BGR structures, when compared to the bulk example, appear to "clamp" the node potential for certain SEU strikes and completely eliminates the possibility of secondary injection by the unstruck nodes since the p– substrate potential is maintained at or very near zero during SEU events. Moreover, simulation studies indicate that the BGR structure would significantly improve SEU and SET soft error when compared to conventional CMOS without BGR protection. The simulation studies also indicate that BGR effectiveness in reducing SEU events depends at least in part on the net resistance of the structure. For example, reducing the resistance of the HDBL in the BGR improved performance of the structure. Such resistance reduction can be optimized, for example, by using shallower HDBL implants, by increasing the implant dose, and/or by optimizing the vertical doping profile.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. Such shorthand phrases for describing circuit operation used herein are more efficient to communicate details of circuit operation, particularly because the schematic diagrams in the figures clearly associate various signal names with the corresponding circuit blocks and nodes.

An insulated gate field effect transistor (IGFET) may be conceptualized as having a control terminal which controls the flow of current between a first current handling terminal and a second current handling terminal. Although IGFET transistors are frequently discussed as having a drain, a gate, and a source, in most such devices the drain is interchangeable with the source. This is because the layout and semiconductor processing of the transistor is frequently symmetrical (which is typically not the case for bipolar transistors). For an N-channel IGFET transistor, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in N-channel IGFET device equations merely refers to whichever drain or source terminal has the lower voltage at any given point in time. For example, the "source" of the N-channel device of a bi-directional CMOS transfer gate depends on which side of the transfer gate is at the lower voltage. To reflect this symmetry of most N-channel IGFET transistors, the control terminal may be deemed the gate, the first current handling terminal may be termed the "drain/source", and the second current handling terminal may be termed the "source/drain". Such a description is equally valid for a P-channel IGFET transistor, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable. It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOS and MOSFET should not only be interpreted to literally specify a metal gate FET having an oxide dielectric.

Regarding power supplies, a single positive power supply voltage (e.g., a 1.5 volt power supply) used to power a circuit is frequently named the "$V_{DD}$" power supply. In an integrated circuit, transistors and other circuit elements are actually connected to a $V_{DD}$ terminal or a $V_{DD}$ node, which is then operably connected to the $V_{DD}$ power supply. The colloquial use of phrases such as "tied to $V_{DD}$" or "connected to $V_{DD}$" is understood to mean "connected to the $V_{DD}$ node", which is typically then operably connected to actually receive the $V_{DD}$ power supply voltage during use of the integrated circuit. The reference voltage for such a single power supply circuit is frequently called "$V_{ss}$." Transistors and other circuit elements are actually connected to a $V_{SS}$ terminal or a $V_{SS}$ node, which is then operably connected to the $V_{SS}$ power supply during use of the integrated circuit. Frequently the $V_{SS}$ terminal is connected to a ground reference potential, or just "ground." Generalizing somewhat, the first power supply terminal is frequently named "$V_{DD}$", and the second power supply terminal is frequently named "$V_{ss}$." Historically the nomenclature "$V_{DD}$" implied a DC voltage connected to the drain terminal of an MOS transistor and $V_{SS}$ implied a DC voltage connected to the source terminal of an MOS transistor. For example, old PMOS circuits used a negative $V_{DD}$ power supply, while old NMOS circuits used a positive $V_{DD}$ power supply. Common usage, however, frequently ignores this legacy and uses $V_{DD}$ for the more positive supply voltage and VSS for the more negative (or ground) supply voltage unless, of course, defined otherwise. Describing a circuit as functioning with a "$V_{DD}$ supply" and "ground" does not necessarily mean the circuit cannot function using other power supply potentials. Other common power supply terminal names are "$V_{CC}$" (a historical term from bipolar circuits and frequently synonymous with a +5 volt power supply voltage, even when used with MOS transistors which lack collector terminals) and "GND" or just "ground."

Moreover, implementation of the disclosed devices and techniques is not limited by CMOS technology, and thus implementations can utilize NMOS, PMOS, and various bipolar or other semiconductor fabrication technologies. While the disclosed devices and techniques have been described in light of the embodiments discussed above, one skilled in the art will also recognize that certain substitutions may be easily made in the circuits without departing from the teachings of this disclosure. Also, many circuits using NMOS transistors may be implemented using PMOS transistors instead, as is well known in the art, provided the logic polarity and power supply potentials are reversed. In this vein, the transistor conductivity type (i.e., N-channel or P-channel) within a CMOS circuit may be frequently reversed while still preserving similar or analogous operation. Moreover, other combinations of output stages are possible to achieve similar functionality.

Although the present invention has been described with respect to a specific preferred embodiment thereof, various changes and modifications may be suggested to one skilled in the art and it is intended that the present invention encompass such changes and modifications that fall within the scope of the appended claims.

What is claimed is:

1. A semiconductor device comprising:
   a substrate having a region of a first conductivity type and a first substrate impurity concentration;
   a first well having the first conductivity type, wherein the first well includes a first well contact region;
   a second well having a second conductivity type opposite the first conductivity type;
   a first transistor comprising a drain region and a source region disposed within the first well;
   a buried layer of the first conductivity type and having a buried layer impurity concentration greater than the first substrate impurity concentration, said buried layer disposed within the substrate below the first well and extending continuously beneath the drain and source regions of the first transistor, and extending continuously beneath a portion of both the first and second wells; and
   a conductive region disposed between the buried layer and one of the first well contact region and a substrate surface terminal within the first well, said conductive region having a smaller lateral extent than that of the first well, and providing a higher conductance between the buried layer and said one of the first well contact region and the substrate surface terminal than a conductance otherwise provided by the first well and the substrate region in the absence of said conductive region.

2. The semiconductor device as recited in claim 1 wherein the conductive region comprises an ohmic fill material.

3. The semiconductor device as recited in claim 1 wherein the conductive region comprises an implanted region not otherwise present within the first well.

4. The semiconductor device as recited in claim 3 wherein the conductive region comprises a plurality of implanted regions not otherwise present within the first well.

5. The semiconductor device of claim 1 wherein the conductive region further comprises a conductance over its entire vertical extent exceeding that corresponding to a p-type impurity region having an impurity concentration greater than $1\times10^{18}$ cm$^{-3}$.

6. The semiconductor device of claim 1 wherein the conductive region extends vertically from the buried layer to said one of the first well contact region and the substrate surface terminal.

7. The semiconductor device of claim 1 wherein the substrate further comprises:
a substrate material; and
an epitaxial layer of semiconductor material formed on the substrate material; wherein the epitaxial layer of semiconductor material includes the substrate region having the first substrate impurity concentration, and wherein at least one of the first well, the buried layer, and conductive region are at least partially located in the epitaxial layer of semiconductor material.

8. The semiconductor device of claim 7 wherein the substrate material is a semiconductor material having the first conductivity type and having an impurity concentration different from the first substrate impurity concentration.

9. The semiconductor device of claim 7 wherein the substrate material is an insulating material.

10. The semiconductor device of claim 1 wherein the substrate further comprises:
a substrate material; and
an insulator film formed on the substrate material; and
a semiconductor film formed on the insulator film; wherein the semiconductor film includes the substrate region having the first substrate impurity concentration, and wherein at least one of the first well, the buried layer, and conductive region are at least partially located in the semiconductor film.

11. The semiconductor device of claim 1 wherein the substrate further comprises:
a buried insulator layer located beneath the buried layer.

12. The semiconductor device of claim 1 wherein said one of the first well contact region and the substrate surface terminal is electrically coupled to a voltage rail.

13. The semiconductor device of claim 1 wherein the conductive region extends between the buried layer and the first well contact region, the conductive region further comprising:
a vertical impurity region having the first conductivity type, and comprising a vertical impurity region impurity concentration greater than the first substrate impurity concentration and greater than $1\times10^{18}$ cm$^{-3}$.

14. The semiconductor device of claim 13 wherein at least one of the buried layer and the vertical impurity region is formed by high-energy ion implantation.

15. The semiconductor device of claim 13 wherein the vertical impurity region is located entirely beneath the first well contact region.

16. The semiconductor device as recited in claim 1 further comprising:
a second transistor comprising a drain region and a source region disposed within the second well;
wherein the buried layer extends continuously beneath both the first and second transistors; and
wherein the first and second transistors comprise complementary field effect transistors connected to form a CMOS inverter circuit.

17. The semiconductor device as recited in claim 1 wherein the conductive region comprises a vertical impurity region of the first conductivity type having an impurity concentration that increases with increasing depth to a local maximum value at a first depth below a surface of the first well, and then decreases with further increasing depth, forming a retrograde impurity concentration peak at the first depth within the vertical impurity region different in magnitude or depth than a retrograde impurity concentration peak, if any, disposed within remaining portions of the first well outside the vertical impurity region.

18. The semiconductor device as recited in claim 17 wherein:
the first depth is deeper than the depth of a retrograde impurity concentration peak, if any, disposed within remaining portions of the first well outside the vertical impurity region.

19. The semiconductor device as recited in claim 17 wherein:
the first depth is at least 0.8 microns below the surface of the first well contact region.

20. The semiconductor device as recited in claim 17 wherein:
the vertical impurity region further comprises a second retrograde impurity concentration peak at a second depth greater than the first depth but less than the buried layer depth below the surface of the first well contact region.

21. The semiconductor device as recited in claim 17 wherein:
the vertical impurity region provides a higher peak impurity concentration than the first well impurity concentration would provide in the absence of the vertical impurity region.

22. The semiconductor device as recited in claim 21 wherein:
the impurity concentration of the vertical impurity region, over a vertical extent from the first well contact to the buried layer, is greater than the first well peak impurity concentration.

23. The semiconductor device as recited in claim 22 wherein:
the vertical impurity region is formed by one or more high-energy ion implantation steps performed at one or more respective energy levels.

24. The semiconductor device as recited in claim 22 wherein:
the vertical impurity region is located entirely beneath the first well contact region, thereby having a lateral extent not substantially wider than the first well contact region.

25. The semiconductor device as recited in claim 22 wherein:
the impurity concentration of the vertical impurity region is at least $1\times10^{18}$ cm$^{-3}$ for its entire vertical extent between the first well contact region and the buried layer.

26. The semiconductor device as recited in claim 17 wherein:

the buried layer depth is within a range from 1-5 microns below the surface of the first well contact region.

27. The semiconductor device as recited in claim 17 further comprising:

a second transistor comprising a drain region and a source region disposed within the second well;

wherein the buried layer extends continuously beneath both the first and second transistors; and;

wherein the first and second transistors comprise complementary field effect transistors connected to form a CMOS inverter circuit.

28. The semiconductor device as recited in claim 27 wherein:

the first well contact region is electrically coupled to a voltage rail.

29. The semiconductor device as recited in claim 27 further comprising:

wherein said vertical impurity region further comprises a second retrograde impurity concentration peak at a second depth greater than the first depth but less than the buried layer depth below the surface of the first well contact region;

wherein the impurity concentration of the vertical impurity region, over its entire vertical extent from the first well contact to the buried layer, is greater than the first well peak impurity concentration; and wherein the first and second transistors comprise complementary field effect transistors connected to form a CMOS inverter circuit.

30. The semiconductor device as recited in claim 29 wherein:

the vertical impurity region is located entirely beneath the first well contact region, thereby having a lateral extent not substantially wider than the first well contact region.

31. The semiconductor device as recited in claim 30 wherein:

the impurity concentration of the buried layer is within a range from $1 \times 10^{17}$ cm$^{-3}$ to $5 \times 10^{21}$ cm$^{-3}$; and the impurity concentration of the vertical impurity region is at least $1 \times 10^{18}$ cm$^{-3}$ for its entire vertical extent between the first well contact region and the buried layer.

* * * * *